(12) United States Patent
Hirakata et al.

(10) Patent No.: US 9,460,940 B2
(45) Date of Patent: *Oct. 4, 2016

(54) METHOD FOR MANUFACTURING SEMICONDUCTOR DEVICE AND MANUFACTURING APPARATUS OF SEMICONDUCTOR DEVICE

(71) Applicant: Semiconductor Energy Laboratory Co., Ltd., Kanagawa-ken (JP)

(72) Inventors: Yoshiharu Hirakata, Kanagawa (JP); Nozomu Sugisawa, Kanagawa (JP); Ryo Hatsumi, Kanagawa (JP); Tetsuji Ishitani, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/825,383

(22) Filed: Aug. 13, 2015

(65) Prior Publication Data

US 2015/0348804 A1 Dec. 3, 2015

Related U.S. Application Data

(63) Continuation of application No. 14/048,376, filed on Oct. 8, 2013, now Pat. No. 9,142,652.

(30) Foreign Application Priority Data

Oct. 12, 2012 (JP) .................................. 2012-226893

(51) Int. Cl.
*H01L 21/34* (2006.01)
*H01L 21/56* (2006.01)
(Continued)

(52) U.S. Cl.
CPC .......... *H01L 21/563* (2013.01); *H01L 23/3142* (2013.01); *H01L 29/66969* (2013.01); *H01L 29/7869* (2013.01); *H01L 2924/0002* (2013.01)

(58) Field of Classification Search
CPC ... H01L 21/67155–21/6723; H01L 29/66969; H01L 29/7869; H01L 29/78693; H01L 51/50–51/56
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1 737 044 A1 12/2006
EP 2 226 847 A2 9/2010
(Continued)

OTHER PUBLICATIONS

Fortunato, E. et al., "Wide-Bandgap High-Mobility ZnO Thin-Film Transistors Produced at Room Temperature," Applied Physics Letters, Sep. 27, 2004, vol. 85, No. 13, pp. 2541-2543.
(Continued)

*Primary Examiner* — Daniel Shook
(74) *Attorney, Agent, or Firm* — Husch Blackwell LLP

(57) ABSTRACT

A semiconductor device including an oxide semiconductor and an organic resin film is manufactured in the following manner. Heat treatment is performed on a first substrate provided with an organic resin film over a transistor including an oxide semiconductor in a reduced pressure atmosphere; handling of the first substrate is performed in an atmosphere containing moisture as little as possible in an inert gas (e.g., nitrogen) atmosphere with a dew point of lower than or equal to −60° C., preferably with a dew point of lower than or equal to −75° C. without exposing the first substrate after the heat treatment to the air; and then, the first substrate is bonded to a second substrate that serves as an opposite substrate.

12 Claims, 11 Drawing Sheets

(51) Int. Cl.
*H01L 29/66* (2006.01)
*H01L 23/31* (2006.01)
*H01L 29/786* (2006.01)

(56) References Cited

U.S. PATENT DOCUMENTS

| | | | |
|---|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 7,932,521 B2 | 4/2011 | Akimoto et al. |
| 8,274,077 B2 | 9/2012 | Akimoto et al. |
| 8,466,463 B2 | 6/2013 | Akimoto et al. |
| 2001/0046027 A1 | 11/2001 | Tai et al. |
| 2002/0056838 A1 | 5/2002 | Ogawa |
| 2002/0084464 A1* | 7/2002 | Yamazaki ............ H01L 27/3246 257/89 |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0072468 A1 | 3/2010 | Yamazaki et al. |
| 2010/0092800 A1 | 4/2010 | Itagaki et al. |
| 2010/0109002 A1 | 5/2010 | Itagaki et al. |
| 2011/0133181 A1 | 6/2011 | Yamazaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| WO | WO 2004/114391 A1 | 12/2004 |

OTHER PUBLICATIONS

Dembo, H. et al., "RFCPUS on Glass and Plastic Substrates Fabricated by TFT Transfer Technology," IEDM 05: Technical Digest of International Electron Devices Meeting, Dec. 5, 2005, pp. 1067-1069.

Ikeda, T. et al., "Full-Functional System Liquid Crystal Display Using CG-Silicon Technology," SID Digest '04: SID International Symposium Digest of Technical Papers, 2004, vol. 35, pp. 860-863.

Nomura, K. et al., "Room-Temperature Fabrication of Transparent Flexible Thin-Film Transistors Using Amorphous Oxide Semiconductors," Nature, Nov. 25, 2004, vol. 432, pp. 488-492.

Park, J. et al., "Improvements in the Device Characteristics of Amorphous Indium Gallium Zinc Oxide Thin-Film Transistors by Ar Plasma Treatment," Applied Physics Letters, Jun. 26, 2007, vol. 90, No. 26, pp. 262106-1-262106-3.

(56) References Cited

OTHER PUBLICATIONS

Takahashi, M. et al., "Theoretical Analysis of IGZO Transparent Amorphous Oxide Semiconductor," IDW '08: Proceedings of the 15th International Display Workshops, Dec. 3, 2008, pp. 1637-1640.

Hayashi, R. et al., "42.1: Invited Paper: Improved Amorphous In—Ga—Zn—O TFTS," SID Digest '08: SID International Symposium Digest of Technical Papers, May 20, 2008, vol. 39, pp. 621-624.

Prins, M. et al., "A Ferroelectric Transparent Thin-Film Transistor," Applied Physics Letters, Jun. 17, 1996, vol. 68, No. 25, pp. 3650-3652.

Nakamura, M. et al., "The Phase Relations in the In2O3—Ga2ZnO4—ZnO System at 1350° C.," Journal of Solid State Chemistry, Aug. 1, 1991, vol. 93, No. 2, pp. 298-315.

Kimizuka, N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Nomura, K. et al., "Thin-Film Transistor Fabricated in Single-Crystalline Transparent Oxide Semiconductor," Science, May 23, 2003, vol. 300, No. 5623, pp. 1269-1272.

Masuda, S. et al., "Transparent Thin Film Transistors Using ZnO as an Active Channel Layer and Their Electrical Properties," Journal of Applied Physics, Feb. 1, 2003, vol. 93, No. 3, pp. 1624-1630.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Osada, T. et al., "15.2: Development of Driver-Integrated Panel using Amorphous In—Ga—Zn—Oxide TFT," SID International Symposium Digest of Technical Papers, May 31, 2009, pp. 184-187.

Nomura, K. et al., "Carrier Transport in Transparent Oxide Semiconductor with Intrinsic Structural Randomness Probed Using Single-Crystalline InGaO3(ZnO)5 Films," Applied Physics Letters, Sep. 13, 2004, vol. 85, No. 11, pp. 1993-1995.

Li, C. et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Son, K. et al., "42.4L: Late-News Paper: 4 Inch QVGA AMOLED Driven by the Threshold Voltage Controlled Amorphous GIZO (Ga2O3—In2O3—ZnO) TFT," SID Digest '08: SID International Symposium Digest of Technical Papers, May 20, 2008, vol. 39, pp. 633-636.

Lee, J. et al., "World's Largest (15-Inch) XGA AMLCD Panel Using IGZO Oxide TFT," SID Digest '08: SID International Symposium Digest of Technical Papers, May 20, 2008, vol. 39, pp. 625-628.

Nowatari, H. et al., "60.2: Intermediate Connector With Suppressed Voltage Loss for White Tandem OLEDS," SID Digest '09: SID International Symposium Digest of Technical Papers, May 31, 2009, vol. 40, pp. 899-902.

Kanno, H. et al., "White Stacked Electrophosphorecent Organic Light-Emitting Devices Employing MOO3 as a Charge-Generation Layer," Advanced Materials, 2006, vol. 18, No. 3, pp. 339-342.

Tsuda, K. et al., "Ultra Low Power Consumption Technologies for Mobile TFT-LCDs," IDW '02: Proceedings of the 9th International Display Workshops, Dec. 4, 2002, pp. 295-298.

Van de Walle, C. "Hydrogen as a Cause of Doping in Zinc Oxide," Physical Review Letters, Jul. 31, 2000, vol. 85, No. 5, pp. 1012-1015.

Fung, T. et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Jeong, J. et al., "3.1: Distinguished Paper: 12.1-Inch WXGA AMOLED Display Driven by Indium—Gallium—Zinc Oxide TFTs Array," SID Digest '08: SID International Symposium Digest of Technical Papers, May 20, 2008, vol. 39, No. 1, pp. 1-4.

Park, J. et al., "High Performance Amorphous Oxide Thin Film Transistors with Self-Aligned Top-Gate Structure," IEDM 09: Technical Digest of International Electron Devices Meeting, Dec. 7, 2009, pp. 191-194.

Kurokawa, Y. et al., "UHF RFCPUS on Flexible and Glass Substrates for Secure RFID Systems," Journal of Solid-State Circiuts , 2008, vol. 43, No. 1, pp. 292-299.

Ohara, H. et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates, D. et al., Optical Studies of the Amorphous Liquid-Cholesteric Liquid Crystal Transition:The "Blue Phase," Physics Letters, Sep. 10, 1973, vol. 45A, No. 2, pp. 115-116.

Cho, D. et al., "21.2:Al and Sn-Doped Zinc Indium Oxide Thin Film Transistors for AMOLED Back-Plane," SID Digest '09: SID International Symposium Digest of Technical Papers, May 31, 2009, pp. 280-283.

Lee, M. et al., "15.4: Excellent Performance of Indium—Oxide-Based Thin-Film Transistors by DC Sputtering," SID Digest '09: SID International Symposium Digest of Technical Papers, May 31, 2009, pp. 191-193.

Jin, D. et al., "65.2: Distinguished Paper: World-Largest (6.5") Flexible Full Color Top Emission AMOLED Display on Plastic Film and its Bending Properties," SID Digest '09: SID International Symposium Digest of Technical Papers, May 31, 2009, pp. 983-985.

Sakata, J. et al., "Development of 4.0-In. AMOLED Display With Driver Circuit Using Amorphous In—Ga—Zn—Oxide TFTS," Proceedings of the 16th International Display Workshops, 2009, pp. 689-692.

Park, J. et al., "Amorphous Indium—Gallium—Zinc Oxide TFTS and Their Application for Large Size AMOLED," AM-FPD '08 Digest of Technical papers, Jul. 2, 2008, pp. 275-278.

Park, S. et al., "Challenge to Future Displays: Transparent AM-OLED Driven by PEALD Grown ZNO TFT," IMID '07 Digest, 2007, pp. 1249-1252.

Godo, H. et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Osada, T. et al., "Development of Driver-Integrated Panel Using Amorphous In—Ga—Zn—Oxide TFT," AM-FPD '09 Digest of Technical Papers, Jul. 1, 2009, pp. 33-36.

Hirao, T. et al., "Novel Top-Gate Zinc Oxide Thin-Film Transistors (ZNO TFTS) for AMLCDS," Journal of the Society for Information Display, 2007, vol. 15, No. 1, pp. 17-22.

Hosono, H., "68.3: Invited Paper:Transparent Amorphous Oxide Semiconductors for High Performance TFT," SID Digest '07: SID International Symposium Digest of Technical papers, 2007, vol. 38, pp. 1830-1833.

Godo, H. et al., "P-9: Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.

Ohara, H. et al., "21.3:4.0 In. QVGA AMOLED Display Using In—Ga—Zn—Oxide TFTS With a Novel Passivation Layer," SID Digest '09: SID International Symposium Digest of Technical papers, May 31, 2009, pp. 284-287.

Miyasaka, M. "SUFTLA Flexible Microelectronics on Their Way to Business," SID Digest '07: SID International Symposium Digest of Technical Papers, 2007, vol. 38, pp. 1673-1676.

Chern, H. et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi, H. et al., "39.1: Invited Paper:Optically Isotropic Nano-Structured Liquid Crystal Composites for Display Applications," SID Digest '09: SID International Symposium Digest of Technical Papers, May 31, 2009, pp. 578-581.

Asaoka, Y. et al., "29.1: Polarizer-Free Reflective LCD Combined With Ultra Low-Power Driving Technology," SID Digest '09: SID International Symposium digest of Technical Papers, May 31, 2009, pp. 395-398.

(56) References Cited

OTHER PUBLICATIONS

Lee, H. et al., "Current Status of, Challenges to, and Perspective View of AM-OLED," IDW '06 Proceedings of the 13th International Display Workshops, Dec. 7, 2006, pp. 663-666.

Kikuchi, H. et al., "62.2: Invited Paper:Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Nakamura, M. "Synthesis of Homologous Compound with New Long-Period Structure," NIRIM Newsletter, Mar. 1, 1995, vol. 150, pp. 1-4.

Kikuchi, H. et al., "Polymer-Stabilized Liquid Crystal Blue Phases," Nature Materials, Sep. 2, 2002, vol. 1, pp. 64-68.

Kimizuka, N. et al., "Spinel,YbFe2O4, and Yb2Fe3O7 Types of Structures for Compounds in the In2O3 and Sc2O3—A2O3—BO Systems [A; Fe, Ga, or Al; B; Mg, Mn, Fe, Ni, Cu, or Zn] at Temperatures over 1000° C.," Journal of Solid State Chemistry, 1985, vol. 60, pp. 382-384.

Kitzerow, H. et al., "Observation of Blue Phases in Chiral Networks," Liquid Crystals, 1993, vol. 14, No. 3, pp. 911-916.

Costello, M. et al., "Electron Microscopy of a Cholesteric Liquid Crystal and Its Blue Phase," Physical Review. A, May 1, 1984, vol. 29, No. 5, pp. 2957-2959.

Meiboom, S. et al., "Theory of the Blue Phase of Cholesteric Liquid Crystals," Physical Review Letters, May 4, 1981, vol. 46, No. 18, pp. 1216-1219.

Park, Sang-Hee et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita, M. et al., "Mechanism of Electrical Conductivity of Transparent InGaZnO4," Physical Review. B, Jan. 15, 2000, vol. 61, No. 3, pp. 1811-1816.

Nomura, K. et al., "Amorphous Oxide Semiconductors for High-Performance Flexible Thin-Film Transistors," Japanese Journal of Applied Physics, 2006, vol. 45, No. 5B, pp. 4303-4308.

Janotti, A. et al., "Native Point Defects in ZnO," Physical Review. B, Oct. 4, 2007, vol. 76, No. 16, pp. 165202-1-165202-22.

Park, J. et al., "Electronic Transport Properties of Amorphous Indium—Gallium—Zinc Oxide Semiconductor Upon Exposure to Water," Applied Physics Letters, 2008, vol. 92, pp. 072104-1-072104-3.

Hsieh, H. et al., "P-29: Modeling of Amorphous Oxide Semiconductor Thin Film Transistors and Subgap Density of States," SID Digest '08: SID International Symposium Digest of Technical Papers, May 20, 2008, vol. 39, pp. 1277-1280.

Janotti, A. et al., "Oxygen Vacancies in ZnO," Applied Physics Letters, 2005, vol. 87, pp. 122102-1-122102-3.

Oba, F. et al., "Defect Energetics in ZnO: A Hybrid Hartree-Fock Density Functional Study," Physical Review. B, 2008, vol. 77, pp. 245202-1-245202-6.

Orita, M. et al., "Amorphous Transparent Conductive Oxide InGaO3(ZnO)m (m<4): a Zn4s Conductor," Philosophical Magazine, 2001, vol. 81, No. 5, pp. 501-515.

Hosono, H. et al., "Working Hypothesis to Explore Novel Wide Band Gap Electrically Conducting Amorphous Oxides and Examples," Journal of non-Crystalline Solids, 1996, vol. 198-200, pp. 165-169.

Mo,Y. et al., "Amorphous Oxide TFT Backplanes for Large Size AMOLED Displays," IDW '08: Proceedings of the 6th International Display Workshops, Dec. 3, 2008, pp. 581-584.

Kim, S. et al., "High-Performance Oxide Thin Film Transistors Passivated by Various Gas Plasmas," 214th ECS Meeting, 2008, No. 2317, ECS.

Clark, S. et al., "First Principles Methods Using CASTEP," Zeitschrift fur Kristallographie, 2005, vol. 220, pp. 567-570.

Lany, S. et al., "Dopability, Intrinsic Conductivity, and Nonstoichiometry of Transparent Conducting Oxides," Physical Review Letters, Jan. 26, 2007, vol. 98, pp. 045501-1-045501-4.

Park, J. et al., "Dry Etching of ZnO Films and Plasma-Induced Damage to Optical Properties," Journal of Vacuum Science & Technology B, Mar. 1, 2003, vol. 21, No. 2, pp. 800-803.

Oh, M. et al., "Improving the Gate Stability of ZnO Thin-Film Transistors With Aluminum Oxide Dielectric Layers," Journal of the Electrochemical Society, 2008, vol. 155, No. 12, pp. H1009-H1014.

Ueno, K. et al., "Field-Effect Transistor on SrTiO3 With Sputtered Al2O3 Gate Insulator," Applied Physics Letters, Sep. 1, 2003, vol. 83, No. 9, pp. 1755-1757.

\* cited by examiner

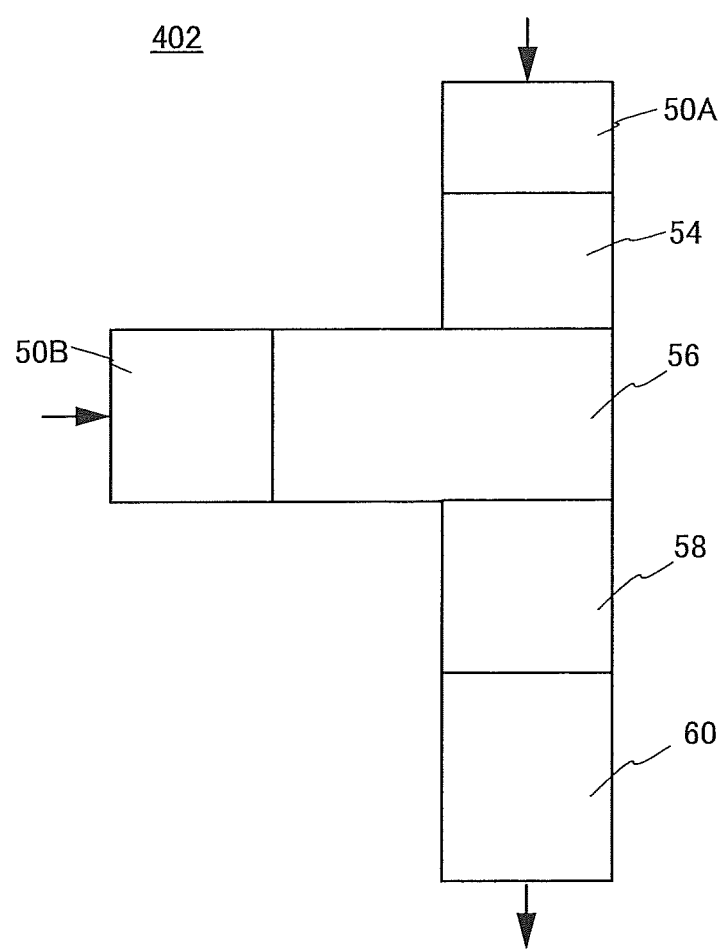

METHOD FOR MANUFACTURING SEMICONDUCTOR DEVICE AND MANUFACTURING APPARATUS OF SEMICONDUCTOR DEVICE

This application is a continuation of copending U.S. application Ser. No. 14/048,376, filed on Oct. 8, 2013 which is incorporated herein by reference.

BACKGROUND OF THE INVENTION

1. Field of the Invention

The present invention disclosed in this specification and the like relates to a method for manufacturing a semiconductor device and a manufacturing apparatus of the semiconductor device.

In this specification and the like, a semiconductor device refers to all types of devices which can function by utilizing semiconductor characteristics; an electro-optical device, an image display device, a semiconductor circuit, and an electronic device are all semiconductor devices.

2. Description of the Related Art

A technique for forming transistors using semiconductor thin films formed over a substrate having an insulating surface has been attracting attention. Such a transistor is applied to a wide range of electronic devices such as an integrated circuit (IC) and an image display device (also simply referred to as a display device). A silicon-based semiconductor material is widely known as a material for a semiconductor thin film applicable to a transistor. As another material, an oxide semiconductor has been attracting attention.

For example, a technique by which a transistor is formed using zinc oxide or an In—Ga—Zn-based oxide semiconductor as an oxide semiconductor is disclosed (see Patent Documents 1 and 2).

REFERENCE

Patent Document

[Patent Document 1] Japanese Published Patent Application No. 2007-123861
[Patent Document 2] Japanese Published Patent Application No. 2007-96055

SUMMARY OF THE INVENTION

However, in a semiconductor device including an oxide semiconductor, an impurity containing hydrogen, such as moisture, in the oxide semiconductor might change the electric conductivity thereof. Such a phenomenon becomes a factor of a change in the electrical characteristics of a transistor using the oxide semiconductor.

In the semiconductor device, an organic resin film is used as a planarization film which planarizes steps caused by transistors. While having an advantage that a preferable flat surface can be easily formed, the organic resin film easily adsorbs moisture. Thus, in the case where the organic resin film is used as a planarization film which covers a transistor including an oxide semiconductor, the electrical characteristics of the transistor might be changed by moisture absorbed in the organic resin film.

In view of the above problem, an object of one embodiment of the present invention is to provide a semiconductor device which includes an oxide semiconductor and an organic resin film and has stable electrical characteristics, and a method for manufacturing thereof.

Further, another abject of one embodiment of the present invention is to provide a manufacturing apparatus capable of manufacturing a semiconductor device which has stable electrical characteristics and high reliability.

In one embodiment of the present invention, a semiconductor device is manufactured in the following manner. Heat treatment is performed on a first substrate provided with an organic resin film over a transistor including an oxide semiconductor in a reduced pressure atmosphere; handling of the first substrate is performed in an atmosphere containing moisture as little as possible (e.g., in an inert gas (e.g., nitrogen) atmosphere with a dew point of lower than or equal to −60° C., preferably with a dew point of lower than or equal to −75° C., or in a dry air atmosphere with a dew point of lower than or equal to −60° C., preferably with a dew point of lower than or equal to −75° C.) without exposing the first substrate after the heat treatment to the air; and then, the first substrate is bonded to a second substrate that serves as an opposite substrate.

Specifically, a semiconductor device is manufactured, by a manufacturing method below, for example.

One embodiment of the present invention is a method for manufacturing a semiconductor device which includes the steps of performing heat treatment in a reduced pressure atmosphere on a first substrate provided with a transistor including an oxide semiconductor layer and an organic resin film provided over the transistor; applying a sealant to one of the first substrate and a second substrate which faces the first substrate; disposing a surface of the first substrate over which the transistor and the organic resin film are provided and the second substrate facing each other, and bonding them to each other; and curing the sealant. The steps from the heat treatment to curing of the sealant are performed in succession in an atmosphere with a dew point of lower than or equal to −60° C. without exposure to the air.

One embodiment of the present invention is a method for manufacturing a semiconductor device which includes the steps of performing heat treatment in a reduced pressure atmosphere on a first substrate provided with a transistor including an oxide semiconductor layer and an organic resin film provided over the transistor; applying a sealant in a frame shape to one of the first substrate and a second substrate which faces the first substrate, and dropping a liquid crystal inside the sealant in a frame shape; disposing a surface of the first substrate over which the transistor and the organic resin film are provided and the second substrate facing each other, and bonding them to each other; and curing the sealant. The steps from the heat treatment to curing of the sealant are performed in succession in an atmosphere with a dew point of lower than or equal to −60° C. without exposure to the air.

One embodiment of the present invention is a method for manufacturing a semiconductor device which includes the steps of performing heat treatment in a reduced pressure atmosphere on a first substrate provided with a transistor including an oxide semiconductor layer, an organic resin film provided over the transistor, and a light-emitting element containing a light-emitting organic compound; applying a sealant to one of the first substrate and a second substrate which faces the first substrate; disposing a surface of the first substrate over which the transistor and the organic resin film are provided and the second substrate facing each other, and bonding them to each other; and curing the sealant. The steps from the heat treatment to curing of the sealant are performed in succession in an atmosphere with a dew point of lower than or equal to −60° C. without exposure to the air.

In any one of the above methods for manufacturing a semiconductor device, before bonding the first substrate and the second substrate to each other, heat treatment is preferably performed on the second substrate in a reduced pressure atmosphere.

In any one of the above methods for manufacturing a semiconductor device, the steps from the heat treatment to curing of the sealant are preferably performed in an inert gas atmosphere.

In any one of the above methods for manufacturing a semiconductor device, bonding of the first substrate and the second substrate are performed in a reduced pressure atmosphere. Specifically, the bonding is preferably performed in an atmosphere at a pressure of 20 kPa to 0.1 Pa, more preferably 100 Pa to 1 Pa.

One embodiment of the present invention includes a manufacturing apparatus of a semiconductor device which is capable of performing the above-described manufacturing steps. That is, another embodiment of the present invention is a manufacturing apparatus of a semiconductor device which includes a heat treatment chamber for heating a substrate in a reduced pressure atmosphere; an application chamber including a first dispenser which applies a sealant and a second dispenser which drops a liquid crystal; a bonding chamber for bonding a pair of substrates, at least one of which is heated in the heat treatment chamber, with the sealant, which is applied in the application chamber, provided therebetween; a curing chamber for curing the sealant; and a transferring chamber for transferring a substrate between the transferring chamber and each of the heat treatment chamber, the application chamber, the bonding chamber, and the curing chamber without exposure to the air. Atmospheres in the heat treatment chamber, the application chamber, the bonding chamber, the curing chamber, and the transferring chamber are each controlled so as to have a dew point of lower than or equal to −60° C.

According to one embodiment of the present invention, a semiconductor device which includes an oxide semiconductor and an organic resin film and has stable electrical characteristics, and a method for manufacturing thereof can be provided.

According to one embodiment of the present invention, a manufacturing apparatus with which it is possible to manufacture a semiconductor device having stable electrical characteristics and high reliability can be provided.

BRIEF DESCRIPTION OF THE DRAWINGS

FIG. 3 illustrates one embodiment of a manufacturing apparatus of a semiconductor device.

DETAILED DESCRIPTION OF THE INVENTION

Figure 1:
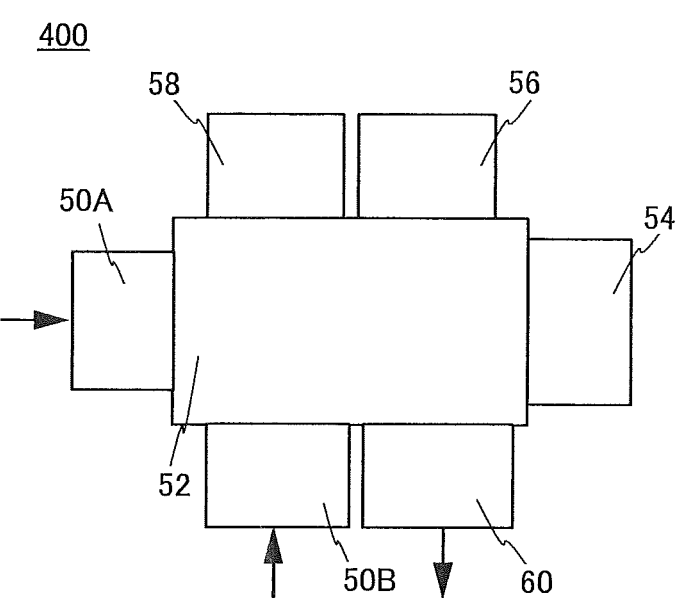
FIG. 1 illustrates one embodiment of a manufacturing apparatus of a semiconductor device.

Hereinafter, embodiments of the present invention will be described in detail with reference to the accompanying drawings. Note that the present invention is not limited to the description below and it is easily understood by those skilled in the art that the mode and details can be changed in various ways. Therefore, the invention should not be construed as being limited to the description in the following embodiments.

Note that in structures of the present invention described below, the same portions or portions having similar functions are denoted by the same reference numerals throughout different drawings, and description thereof is not repeated.

Note that in each drawing described in this specification, the size, the film thickness, or the region of each component is exaggerated for clarity in some cases. Therefore, embodiments of the present invention are not limited to such scales.

Note that the ordinal numbers such as "first" and "second" in this specification and the like are used for convenience and do not denote the order of steps or the stacking order of layers. In addition, the ordinal numbers in this specification do not denote particular names which specify the present invention.

In this specification, a term "parallel" indicates that two straight lines are provided so that the angle formed therebetween is greater than or equal to −10° and less than or equal to 10°, and accordingly also includes the case where the angle is greater than or equal to −5° and less than or equal to 5°. In addition, a term "perpendicular" indicates that two straight lines are provided so that the angle formed therebetween is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

(Embodiment 1)

In this embodiment, a manufacturing apparatus and a method for manufacturing a semiconductor device using the manufacturing apparatus according to one embodiment of the present invention are described with reference to FIG. 1, FIGS. 2A to 2D, and FIG. 3.

<1-1. Structure 1 of Manufacturing Apparatus>

FIG. 1 illustrates an example of a plan view of a manufacturing apparatus 400. The manufacturing apparatus 400 in FIG. 1 is a manufacturing apparatus for bonding an element substrate (hereinafter also referred to as a first substrate) provided with a transistor and an opposite substrate (hereinafter also referred to as a second substrate) (a cell process).

The manufacturing apparatus 400 illustrated in FIG. 1 includes a first heat treatment chamber 50A, a second heat treatment chamber 50B, an application chamber 54 including a dispenser for applying a sealant, a bonding chamber 56 in which a pair of substrates is bonded with the sealant, which is applied in the application chamber 54, provided therebetween, a curing chamber 58 for curing the sealant, and a transferring chamber 52 for transferring a substrate between the treatment chambers. In addition, an unloading chamber 60 for unloading the bonded substrates may be included as a component of the manufacturing apparatus 400.

In the manufacturing apparatus 400 in FIG. 1, the first heat treatment chamber 50A, the second heat treatment chamber 50B, the application chamber 54, the bonding chamber 56, the curing chamber 58, the unloading chamber 60, and the transferring chamber 52 are controlled so as to contain moisture as little as possible. For example, the inside of the manufacturing apparatus 400 is controlled to have an inert gas atmosphere with a dew point of −60° C. or lower, preferably −75° C. or lower (a dry nitrogen gas atmosphere or a dry argon gas atmosphere), or a dry air atmosphere with a dew point of −60° C. or lower, preferably −75° C. or lower.

Further, the substrates (the first substrate and the second substrate) are processed in succession in each treatment chamber without being exposed to the air after being carried into the first heat treatment chamber 50A or the second heat treatment chamber 50B and before being carried out from the unloading chamber 60. Note that the arrows in FIG. 1 indicate the substrate carry-in/out directions.

<1-2. Structure of Each Treatment Chamber>

An example of a structure of a treatment chamber included in the manufacturing apparatus 400 is described with reference to FIGS. 2A to 2D.

<1-2-1. Heat Treatment Chamber>

Figure 2A:
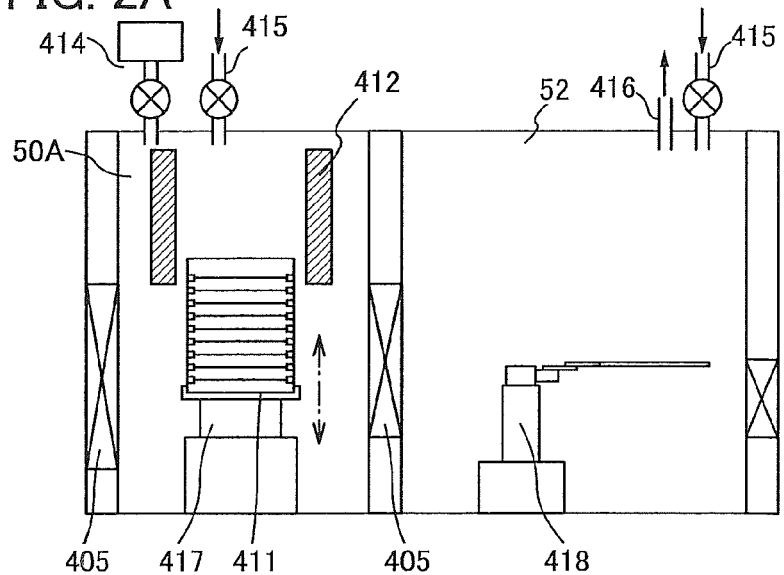
FIGS. 2A to 2D each illustrate one embodiment of a treatment chamber of a manufacturing apparatus.

The first heat treatment chamber 50A is a treatment chamber in which substrates carried into the manufacturing apparatus 400 are heated in a reduced-pressure atmosphere (see FIG. 2A). In the first heat treatment chamber 50A, with the use of a heater 412, heat treatment is performed on the substrates in a cassette 411 capable of holding a plurality of substrates, while the cassette 411 is moved up and down by an elevator 417.

When the heat treatment is performed, the atmosphere is controlled to have a pressure of 1 Pa or less, preferably $10^{-4}$ Pa or less and a dew point of −60° C. or less, preferably −80° C. or less in such a manner that the air in the treatment chamber is exhausted via an exhaust port 414 so that the pressure in the treatment chamber is reduced, and an inert gas such as nitrogen or argon or a dry air is introduced from a gas introducing port 415.

Note that in FIG. 2A, an example in which the cassette 411 is moved up and down by the elevator 417 that is provided on the lower side in the treatment chamber is illustrated; however, this embodiment is not limited to this. For example the elevator 417 may be provided on the upper side in the treatment chamber. Further, in FIG. 2A, an example in which the gas introducing port 415 and the exhaust port 414 are provided on the upper side in the treatment chamber is illustrated; however, the positions of the gas introducing port 415 and the exhaust port 414 are not limited to them.

The second heat treatment chamber 50B has a structure similar to that of the first heat treatment chamber 50A. Note that the manufacturing apparatus 400 in FIG. 1 has two heat treatment chambers as an example; however, this embodiment is not limited to this structure. The manufacturing apparatus 400 has at least one heat treatment chamber, or may have three or more heat treatment chambers.

<1-2-2. Transferring Chamber>

The transferring chamber 52 is a treatment chamber through which a substrate is transferred to each treatment chamber (see FIG. 2A). When a substrate is transferred, a shutter 405 provided between the transferring chamber and each treatment chamber is opened, and the substrate is moved on a sheet-by-sheet basis by a transferring arm 418.

The inside of each treatment chamber provided in the manufacturing apparatus 400 is controlled to have an atmosphere with a dew point of −60° C. or less, preferably −80° C. or less using the gas introducing port 415 and a check valve 416. When the treatment chamber has the exhaust port 414, the check valve 416 is not necessarily provided.

<1-2-3. Application Chamber>

Figure 2B:
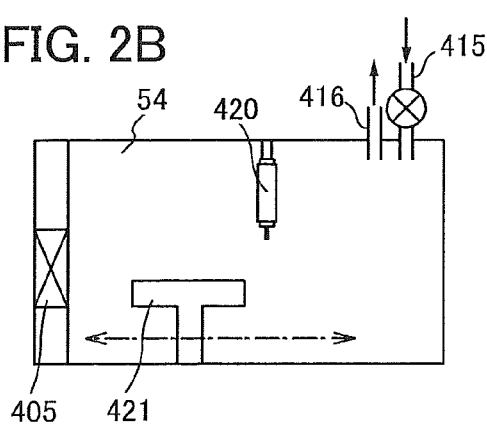

The application chamber 54 is a treatment chamber in which a sealant is applied to a substrate (see FIG. 2B). In the application chamber 54, after the substrate is mounted on a stage 421, a dispenser 420 and the stage 421 are relatively moved, whereby the sealant is applied to a predetermined position on the substrate.

In FIG. 2B, the case where the stage 421 is moved is illustrated; however, this embodiment is not limited to this. The dispenser 420 may be moved; alternatively, both the stage 421 and the dispenser 420 may be moved. Further, a plurality of dispensers 420 may be provided, and a dispenser capable of applying a material (e.g., a liquid crystal, a drying agent, or an anisotropic conductive resin, or the like) other than the sealant may be provided in addition to the dispenser for applying the sealant.

<1-2-4. Bonding Chamber>

Figure 2C:
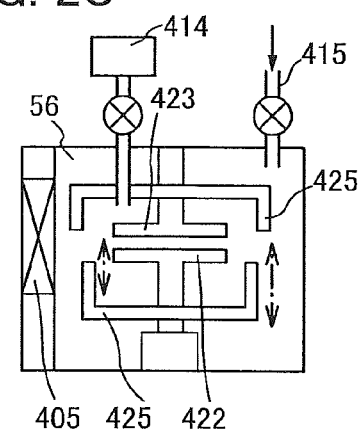

The bonding chamber 56 is a treatment chamber in which the first substrate and the second chamber are bonded to each other (see FIG. 2C). The substrate to which the sealant is applied in the application chamber 54 is mounted on a first stage 422 so as to face a substrate arranged on a second stage 423. When bonding is performed, after the first stage 422 and/or the second stage 423 is moved up/down so that the pair of substrates is brought close to each other, barriers 425 are moved so as to form a closed space. Subsequently, the air inside the closed space is exhausted via the exhaust port 414 so that the pressure in the closed space is reduced. The bonding is performed in an atmosphere at a pressure of 20 kPa to 0.1 Pa, more preferably 100 Pa to 1 Pa.

Note that the barriers 425 are not necessarily provided. However, the provision of the barriers 425 is preferable because the volume of the closed space that has a reduced pressure atmosphere can be reduced compared with the case where the whole bonding chamber 56 has a reduced pressure atmosphere and thus the productivity can be improved.

<1-2-5. Curing Chamber>

Figure 2D:
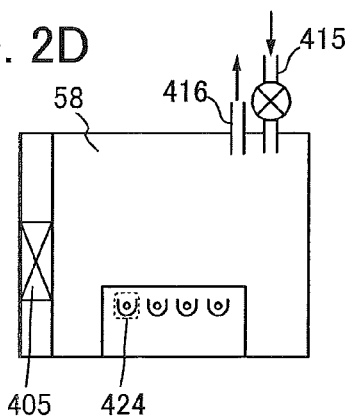

The curing chamber 58 is a treatment chamber in which the sealant after the bonding is cured (see FIG. 2D). For example, in the case of using an ultraviolet curable resin as the sealant, the sealant can be cured using a UV lamp 424 in the curing chamber 58.

When the pair of substrates is transferred from the bonding chamber 56 to the curing chamber 58, it is preferable that the substrates are temporarily bonded to each other in the bonding chamber 56 so that positional misalignment of the pair of substrates is prevented.

<1-3. Cell Process>

A cell process using the manufacturing apparatus 400 illustrated in FIG. 1 and FIGS. 2A to 2D are described below.

First, after being carried into the heat treatment chamber 50A, the first substrate is subjected to heat treatment in a reduced pressure atmosphere. Next, in the application chamber 54, the sealant is applied to either one of the first substrate and the second substrate after the heat treatment. After that, the first substrate and the second substrate are disposed so as to face each other and bonded to each other in the bonding chamber 56; then, the sealant is cured in the curing chamber 58. The pair of substrates with the sealant cured is carried out from the unloading chamber 60. In this manner, a semiconductor device of this embodiment can be manufactured. In the manufacturing apparatus 400 described in this embodiment, the substrates are moved between the treatment chambers via the transfer chamber 52, so that the cell process can be performed without exposure to the air.

<1-4. Structure 2 of Manufacturing Apparatus>

FIG. 3 illustrates another structural example of the manufacturing apparatus.

FIG. 3 is an example in which a plurality of treatment chambers is arranged on a substantially straight line. In a manufacturing apparatus 402 illustrated in FIG. 3, without arrangement of the transfer chamber 52 at the center, a substrate can be transferred to treatment chambers in succession using a transfer mechanism or the like arranged in each treatment chamber, for example. The floor area (so-called footprint) of the apparatus can be reduced with the structure in FIG. 3.

Note that the structure of the manufacturing apparatus is not limited to this, and can be properly changed depending on the layout of a clean room, or the like.

The structures and methods described in this embodiment can be combined as appropriate with any of the methods and structures described in the other embodiments.

(Embodiment 2)

In this embodiment, a method for manufacturing a semiconductor device (also referred to as a display device) having a display function using the manufacturing apparatus described in Embodiment 1 is described.

<2-1. Structure of Display Device>

Figure 4:
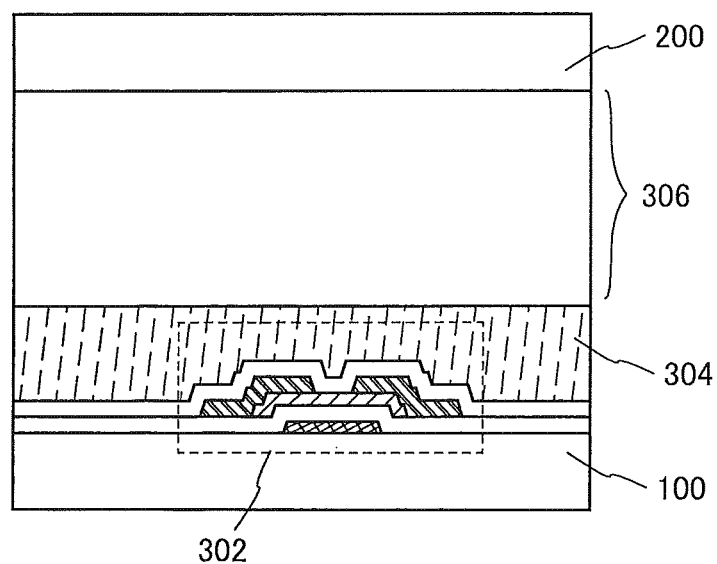
FIG. 4 is a conceptual diagram of a structure of a display device.

FIG. 4 shows a conceptual diagram of the structure of a display device. In the display device, a first substrate 100 provided with a transistor 302 and a second substrate 200 are bonded to each other with a display element 306 provided therebetween. As the display element 306, for example, a liquid crystal element, a light-emitting element, or the like can be used.

In this embodiment, a transistor including an oxide semiconductor film in a channel formation region is used as the transistor 302. A transistor with a bottom gate structure is illustrated in FIG. 4 as an example; however, the structure is not limited to this, and a transistor with a top gate structure may be employed.

An oxide semiconductor is a semiconductor material whose band gap can be wider than that of silicon and whose intrinsic carrier density can be lower than that of silicon. Thus, the off-state current of the transistor 302 including an oxide semiconductor film can be extremely low compared with a transistor including an amorphous silicon film or a polycrystalline silicon film. Therefore, reduction in power consumption of the display device can be achieved by forming a backplane (a circuit board) of a liquid crystal display device or an organic EL display device using a transistor including an oxide semiconductor film.

As a base film of the display element 306, an organic resin film 304 is preferably formed. For example, in the case of using a liquid crystal element as the display element 306, an alignment defect of liquid crystal molecules can be prevented by provision of the organic resin film 304 functioning as a planarization film. Further, in the case of using a light-emitting element containing an organic compound as the display element 306, disconnection of a light-emitting layer caused due to its small thickness can be prevented by provision of the organic resin film 304 functioning as a planarization film.

While having advantages that a preferable flat surface is easily formed and the relative permittivity is lower than that of an inorganic insulating film, an organic resin film easily adsorbs moisture. Meanwhile, in an oxide semiconductor, hydrogen becomes a supply source of carriers, and a donor is generated at a level close to the conduction band (a shallow level) to lower the resistance (make the oxide semiconductor an n-type oxide semiconductor) when hydrogen is contained in the oxide semiconductor. Thus, moisture is an impurity for the oxide semiconductor, and is a factor of a change in the electrical characteristics of a transistor.

<2-2. Characteristics of Organic Resin Film>

Results of examining the amount of moisture released from a circuit board including an organic resin film by thermal desorption spectroscopy (TDS) are described below.

First, seven circuit boards A to G which were used for the TDS are described.

The circuit boards A to D are each a substrate over which an organic resin film is formed as a planarization film and an alignment film of a liquid crystal element is formed over the organic resin film. The circuit boards A to D were formed in the same process up to and including formation of the alignment film. Further, in each of the circuit boards A to D, a 3-μm-thick organic resin film including an acrylic resin is formed between a transistor and a pixel electrode.

The circuit board A was not subjected to heat treatment after formation of the alignment film. The circuit board B was subjected to heat treatment at 160° C. for one hour in a reduced pressure atmosphere of about $10^{-5}$ Pa after formation of the alignment film. The circuit board C was subjected to heat treatment at 150° C. for six hours in an air atmosphere after formation of the alignment film. The circuit board D was subjected to heat treatment at 160° C. for one hour in a reduced pressure atmosphere of about $10^{-5}$ Pa and then was exposed to an air atmosphere for ten minutes.

The circuit boards E to G were formed in the same process up to and including formation of the alignment film. The circuit boards E to G each have a structure in which an organic resin film including an acrylic resin is not provided between a transistor and a pixel electrode and a pixel electrode is provided over an inorganic insulating film that covers the transistor. The circuit board E was not subjected to heat treatment after formation of the alignment film. The circuit board F was subjected to heat treatment at 160° C. for one hour in a reduced pressure atmosphere of about $10^{-5}$ Pa after formation of the alignment film. The circuit board G was subjected to heat treatment at 150° C. for six hours in an air atmosphere after formation of the alignment film.

In the TDS, the temperature of each board was raised from 60° C. to 230° C. at a speed of 20° C. per minute and the number of desorbed gas molecules having a mass-to-charge ratio (m/z) of 18 was measured. Note that it is expected that the gas molecules having a mass-to-charge ratio (m/z) of 18 mainly include water. Further, an atmospheric pressure at the beginning of the measurement in a measurement chamber in which the circuit board was placed was $1.2 \times 10^{-7}$ Pa.

Figure 5:
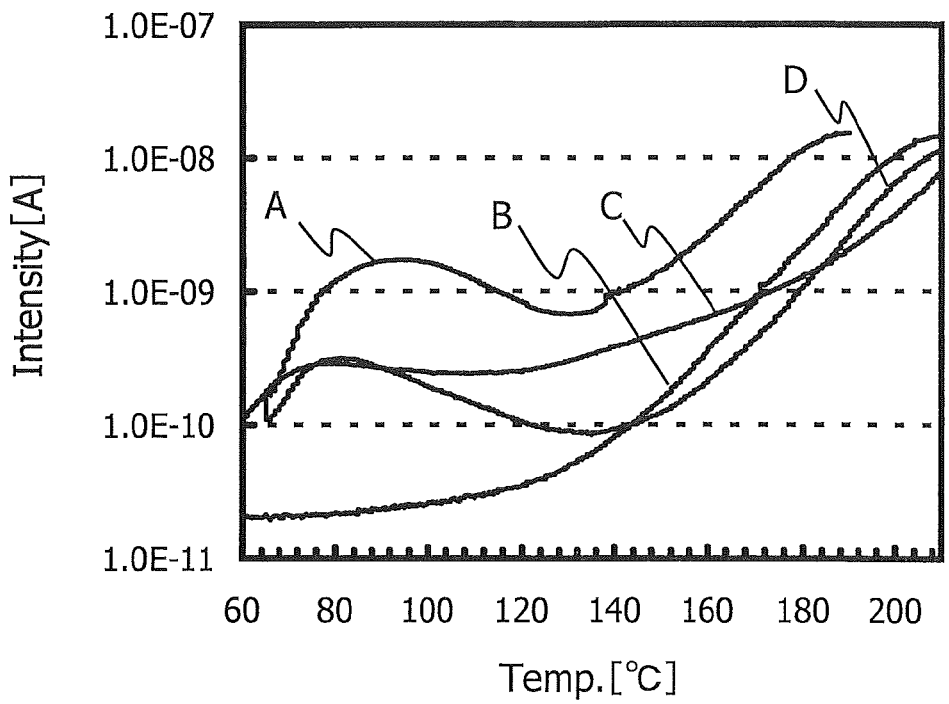
FIG. 5 is a graph showing the intensities of gas molecules having a mass-to-charge ratio (m/z) of 18 and being desorbed from circuit boards each including an organic resin film.

FIG. 5 shows the intensities of gas molecules having a mass-to-charge ratio (m/z) of 18 and being desorbed from each of the circuit boards A to D, which were obtained by TDS.

The circuit board A which was not subjected to heat treatment has a peak showing desorption of water at a substrate temperature around 90° C. On the other hand, unlike the circuit board A, the circuit board B which was subjected to heat treatment in a reduced pressure atmosphere does not have a peak showing desorption of water at a substrate temperature around 90° C.

When the circuit board B which was subjected to heat treatment in a reduced pressure atmosphere is compared with the circuit board C which was subjected to heat treatment in an air atmosphere, the circuit board C has higher intensity showing desorption of water than the circuit board B at substrate temperatures of 160° C. or less. Thus, it is expected that the amount of water included in each film included in the circuit board B which was subjected to heat treatment in a reduced pressure atmosphere is smaller than that in the circuit board C which was subjected to heat treatment in an air atmosphere.

Further, the circuit board D which was exposed to an air atmosphere after heat treatment in a reduced pressure atmosphere has a peak showing desorption of water at a substrate temperature around 80° C. When the circuit board B which was subjected to heat treatment in a reduced pressure atmosphere is compared with the circuit board D which was exposed to an air atmosphere after the heat treatment in a reduced pressure atmosphere, it is expected that the amount of water included in each film included in the circuit board D is larger than that in the circuit board B.

Figure 6:
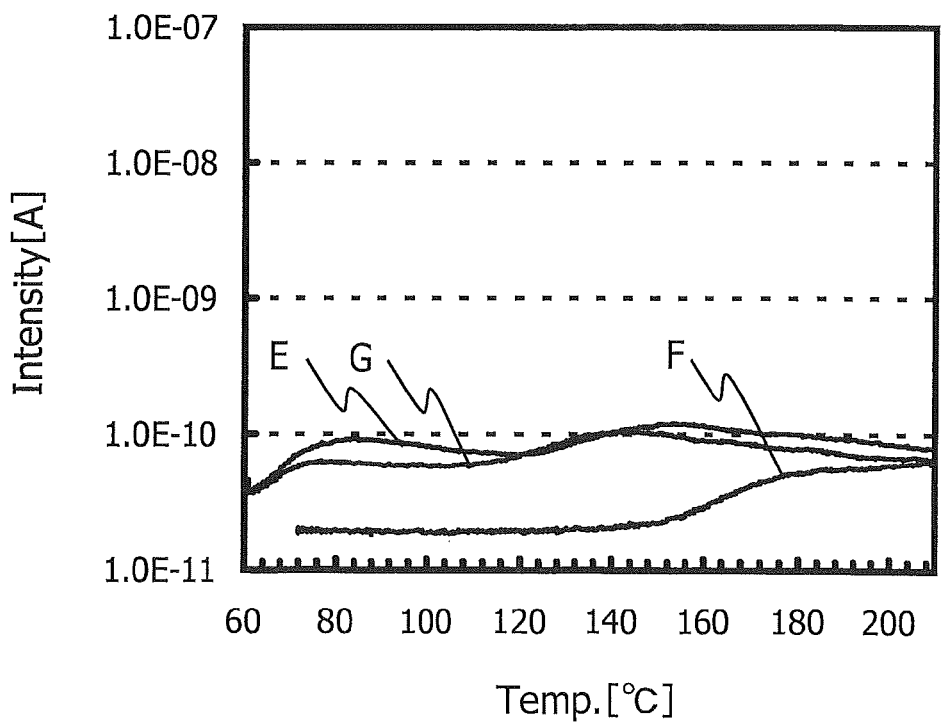
FIG. 6 is a graph showing the intensities of gas molecules having a mass-to-charge ratio (m/z) of 18 and being desorbed from circuit boards each not including an organic resin film.

FIG. 6 shows the intensities of gas molecules having a mass-to-charge ratio (m/z) of 18 and being desorbed from each of the circuit boards E to which were obtained by TDS.

When the intensity showing desorption of water of the circuit board A including the organic resin film, which is shown in FIG. 5, is compared with that of the circuit board E not including the organic resin film, which is shown in FIG. 6, it is found that the intensity of the circuit board A is higher than that of the circuit board E in all the temperature ranges. Thus, as for the circuit boards A and E each of which was not subjected to heat treatment after formation of the alignment film, it can be considered that more water is desorbed from the circuit board A including the organic resin film and that difference in the amount of desorbed water is caused by water included in the organic resin film.

When the intensity of the circuit board C including the organic resin film, which is shown in FIG. 5, is compared with that of the circuit board G not including the organic resin film, which is shown in FIG. 6, it is found that the intensity of the circuit board C is higher than that of the circuit board G in all the temperature ranges. Thus, as for the circuit boards C and G each of which was subjected to heat treatment in an air atmosphere after formation of the alignment film, it can be considered that more water is desorbed from the circuit board C including the organic resin film and that the difference in the amount of desorbed water is caused by water included in the organic resin film.

Further, when the intensity showing desorption of water of the circuit board B including the organic resin film, which is shown in FIG. 5, is compared with that of the circuit board F not including the organic resin film, which is shown in FIG. 6, there are no significant difference in the intensities at temperatures of 100° C. or less, and the intensity of the circuit board B becomes higher when the temperature exceeds 100° C. Thus, as for the circuit boards B and F each of which was subjected to heat treatment in a reduced pressure atmosphere after formation of the alignment film, it can be considered that more water are desorbed from the circuit board B including the organic resin film and that the difference in the amount of desorbed water is caused by water included in the organic resin film. However, as for the circuit boards B and F each of which was subjected to heat treatment in a reduced pressure atmosphere, the difference in the amount of released water is smaller than that in the case of the circuit boards A and E and that in the case of the circuit boards C and G Accordingly, it is considered that water included in the organic resin film is effectively desorbed by heat treatment in a reduced pressure atmosphere compared with the case where heat treatment is not performed or the case where heat treatment is performed in an air atmosphere.

The above-described results of the TDS show that the display device manufactured using a manufacturing apparatus of one embodiment of the present invention, in which a display element can be sealed between substrates without being exposed to the air (e.g., in a nitrogen atmosphere) after heat treatment at 160° C. in a reduced pressure atmosphere, contains little water in the organic resin film.

<2-3. Method for Manufacturing Display Device>

A method for manufacturing a semiconductor device using the manufacturing apparatus 400 is described below with reference to FIGS. 7A to 7E. In this embodiment, description is made below on a case where a liquid crystal display panel is manufactured as an example of a display panel.

In this embodiment, a method for manufacturing one liquid crystal display device from a pair of substrates is shown; however, without limitation thereto, this embodiment can also be applied to the case where a plurality of liquid crystal display devices is manufactured over a large-sized substrate (obtaining a plurality of panels).

<2-3-1. Heat Treatment>

Figure 7A:
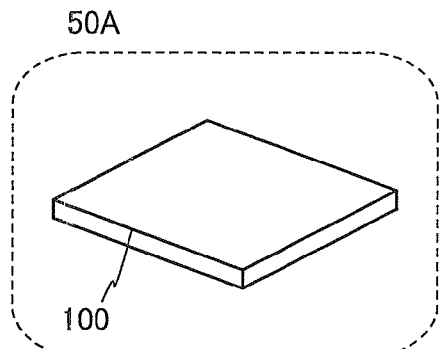
FIGS. 7A to 7E are perspective views illustrating manufacturing steps of a semiconductor device.

First, the first substrate 100 provided with a transistor and a planarization film over the transistor is carried into the first heat treatment chamber 50A, and is subjected to heat treatment in a reduced pressure atmosphere (see FIG. 7A).

In this embodiment, as the transistor provided over the first substrate 100, a transistor including an oxide semiconductor is used. Further, as the planarization film, an organic resin film is used.

Heat treatment is performed on the first substrate 100 provided with the organic resin film over the transistor including an oxide semiconductor, whereby moisture is desorbed (dehydrated) from the organic resin film and impurities such as moisture or hydrogen can be prevented from entering the oxide semiconductor. Further, the heat treatment is preferably performed in a reduced pressure atmosphere because not only moisture (adsorbed water) adsorbed to a surface of the organic resin film but also moisture in the organic resin film can be dehydrated.

Further, when an alignment film is formed over the first substrate 100, the heat treatment is preferably performed in a reduced pressure atmosphere because impurities such as water or hydrogen can be desorbed also from the alignment film. In this embodiment, the first substrate 100 provided with the alignment film which has been subjected to rubbing treatment is carried into the first heat treatment chamber 50A.

The heating temperature is preferably 100° C. or higher, more preferably 150° C. or higher. The upper limit of the heating temperature varies depending on materials used for the organic resin film. In the case where an acrylic-based resin is used, the upper limit of the heating temperature is about 180° C. to 250° C., and in the case where a polyimide-based resin is used, the upper limit of the heating temperature is about 250° C. to 300° C. However, the heating temperature may be set as appropriate in consideration of the material to be used and the degree of vacuum at the time of reducing pressure.

Further, the reduced pressure atmosphere has a pressure lower than the atmospheric pressure, preferably lower than or equal to 1 Pa, more preferably lower than or equal to $10^{-4}$ Pa. Here, Pa represents the degree of vacuum; that is, "lower than or equal to" means the direction in which the degree of vacuum is higher.

In this embodiment, the first substrate 100 is subjected to the heat treatment at 160° C. for one hour in an atmosphere where the pressure is reduced to $10^{-5}$ Pa.

The first substrate 100 after the heat treatment is transferred to the bonding chamber 56 via the transfer chamber 52. The movement of substrates via the transfer chamber 52 is successively performed without being exposed to the air.

Figure 7B:
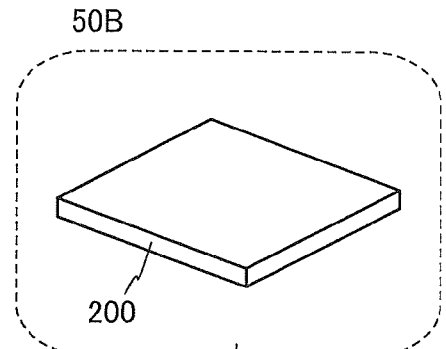

Further, the second substrate 200 is carried into the second heat treatment chamber 50B and is subjected to heat treatment in a reduced pressure atmosphere (see FIG. 7B). Note that the heat treatment on the second substrate 200 may precede the heat treatment on the first substrate 100 and the second substrate 200 may be kept in a vacuum. Further, the condition of the heat treatment on the second substrate 200 can be similar to that on the first substrate 100.

Note that when the second substrate 200 does not include an organic resin film, the heat treatment is not necessarily performed on the second substrate 200. However, the heat treatment is preferably performed on the second substrate 200 in a reduced pressure atmosphere because water adsorbed to a surface of the second substrate 200 can be released by the heat treatment and impurities such as moisture in a region that is sealed in a later step can be reduced.

Further, when an alignment film is formed over the second substrate 200, the heat treatment is preferably performed on the second substrate 200 in a reduced pressure atmosphere because impurities such as water or moisture can be released also from the alignment film.

In this embodiment, the second substrate 200 provided with an alignment film which has been subjected to rubbing treatment is carried into the second heat treatment chamber 50B and is subjected to heat treatment at 160° C. for one hour in an atmosphere where the pressure is reduced to $10^{-5}$ Pa.

In FIGS. 7A to 7E, an example of the case where the first substrate 100 and the second substrate 200 are subjected to heat treatment in respective heat treatment chambers is illustrated; however, this embodiment is not limited to this. The first substrate 100 and the second substrate 200 may be subjected to heat treatment in the same heat treatment chamber; alternatively, a structure may be employed in which a plurality of the first substrate 100 or a plurality of the second substrate 200 is subjected to heat treatment in a plurality of heat treatment chambers. If the manufacturing apparatus 400 has a plurality of heat treatment chambers, the semiconductor device can be efficiently manufactured. Further, it is preferable that batch processing can be performed in the first heat treatment chamber 50A and the second heat treatment chamber 50B because heat treatment can be performed on a plurality of substrates at the same time.

<2-3-2. Application of Sealant and Drop of Liquid Crystal>

The second substrate 200 after the heat treatment is transferred to the application chamber 54 via the transfer chamber 52.

Figure 7C:
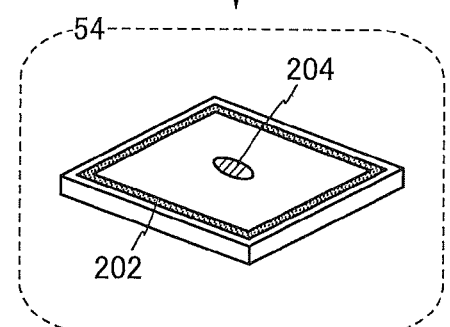

In the application chamber 54, a sealant 202 is applied in a frame shape to the second substrate 200 after the heat treatment, and a liquid crystal 204 is dropped inside the sealant in a frame shape (see FIG. 7C).

When a plurality of panels is obtained from one substrate, the sealant may be applied in a plurality frame shapes.

As the sealant 202, a photocurable resin, a thermosetting resin, a photocurable and thermosetting resin, or the like is preferably used. For example, an acrylic-based resin, an epoxy-based resin, an acrylate-based (urethane acrylate) resin, an amine-based resin, or a resin in which an acrylic-based resin and an epoxy-based resin are mixed can be used. Further, a photopolymerization initiator (typically, an ultraviolet light polymerization initiator), a thermosetting agent, a filler, or a coupling agent may be included in the sealant 202. Note that a photocurable resin is cured by light irradiation and a thermosetting resin is cured by heat treatment. A photocurable and thermosetting resin is temporarily cured (pre-cured) by light irradiation and then fully cured by heat treatment.

Moreover, the sealant 202 may be formed in a frame shape (closed-loop shape). In FIG. 7C, the case where the sealant 202 is formed in a rectangular frame shape is described. Note that the shape of the sealant 202 is not limited to the rectangular frame shape, and the sealant 202 may be formed in a circular frame shape, an elliptical frame shape, a polygonal frame shape other than the rectangular frame shape, or the like. Alternatively, the sealant 202 may be formed so as to foul' double or more frames, in that case, materials for the sealants of the inner frame and the outer frame may be different.

For the liquid crystal 204, a low-molecular liquid crystal, a ferroelectric liquid crystal, an anti-ferroelectric liquid crystal, or the like can be used. Further, for a liquid crystal material, a liquid crystal composition in which a chiral agent, a polymerizable monomer, and a polymerization initiator are mixed may be used.

Note that FIG. 7C illustrates a case where one droplet of the liquid crystal 204 is dropped inside the sealant 202. However, this embodiment is not limited to such a manner, and appropriate amounts of the liquid crystal material may be dropped at appropriate places on the inner side than the sealant 202 in a frame shape.

Further, a third dispenser that is used for dropping an anisotropic conductive resin for electrical connection with a flexible printed circuit (FPC) may be provided in the application chamber 54.

Note that in this embodiment, an example of the case where the liquid crystal display device is manufactured using the manufacturing apparatus 400 is described; however, this embodiment is not limited to this. For example, an electroluminescence (EL) display device may be manufactured using the manufacturing apparatus 400 in such a manner that a first substrate that is provided with a transistor including an oxide semiconductor layer, an organic resin film provided over the transistor, and a light-emitting element including a light-emitting organic compound, and a second substrate are bonded to each other. In that case, in the application chamber 54, a sealant for solid sealing can be applied. Instead of a liquid crystal, a drying agent may be dropped or applied.

<2-3-3. Bonding>

After the liquid crystal 204 is dropped, the second substrate 200 is transferred to the bonding chamber 56 via the transfer chamber 52.

Figure 7D:
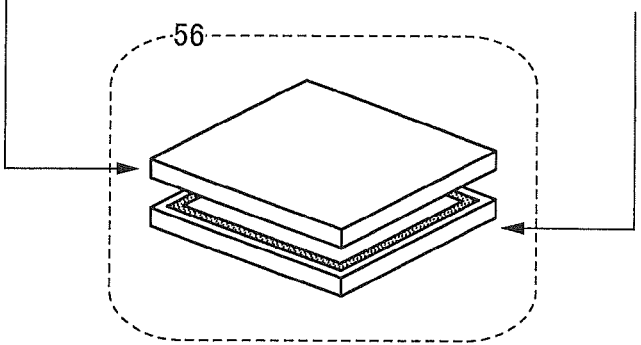

In the bonding chamber 56, a surface of the first substrate 100 over which the transistor and the organic resin film are provided and the second substrate 200 are disposed to face each other, and the first substrate 100 and the second substrate 200 are bonded to each other (see FIG. 7D).

When the first substrate 100 and the second substrate 200 are bonded to each other, the dropped liquid crystal 204 spreads over inside the frame of the sealant 202; thus, a liquid crystal layer is formed. Note that depending on the viscosity of the dropped liquid crystal, the liquid crystal layer does not spread over the entire surface inside the frame of the sealant 202 (the liquid crystal layer is not in contact with the sealant 202) at the stage of bonding the first substrate 100 and the second substrate 200 in some cases.

The first substrate 100 and the second substrate 200 are bonded to each other in a reduced pressure atmosphere. This is because when the substrates are bonded to each other in a reduced pressure atmosphere, even if the substrates are exposed to the atmospheric pressure after the bonding, the inside of the frame of the sealant 202 can be kept in a reduced pressure and the liquid crystal can finally spread to be in contact with the sealant 202. Further, this is because the sealant is prevented from tearing due to pressure caused by compression of a gas inside the frame of the sealant 202 at the time of sealing. The reduced pressure atmosphere preferably has a pressure lower than the atmospheric pressure, more preferably 100 Pa or lower, for example.

The bonding chamber 56 preferably has a lower vacuum state than each of the first heat treatment chamber 50A and the second heat treatment chamber 50B. For example, the atmosphere in the bonding chamber 56 is preferably set at a pressure of 20 kPa to 0.1 Pa, more preferably 100 Pa to 1 Pa.

Note that after the sealant 202 is formed over the second substrate 200 or after the first substrate 100 and the second substrate 200 are bonded to each other, the sealant 202 may be temporarily cured through light irradiation or heat treatment. Note that instead of using the sealant 202 in a frame shape, a sealant for temporary bonding substrates may be applied to an edge portion of the substrate 200; in that case, the sealant for temporary bonding may be temporarily cured.

The sealant 202 is temporarily cured, so that the sealant 202 and the substrates (the first substrate 100 and the second substrate 200) are firmly bonded to each other and positional misalignment of the top and bottom substrates can be prevented.

Further, FIGS. 7A to 7E illustrate the case where the sealant 202 and the liquid crystal 204 are provided on the second substrate 200 side; however, the sealant 202 and the liquid crystal 204 may be provided on the first substrate 100 side.

<2-3-4. Curing of Sealant>

Figure 7E:
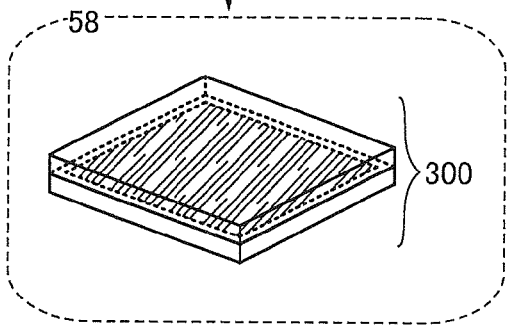

After being bonded to each other in the bonding chamber 56, the first substrate 100 and the second substrate 200 are transferred to the curing chamber 58 via the transfer chamber 52; then, cure treatment of the sealant 202 is performed (see FIG. 7E). Note that the cure treatment is performed in an atmospheric pressure atmosphere.

The cure treatment may be set as appropriate in accordance with the material of the sealant. For example, when a thermosetting resin is used for the sealant 202, heat treatment is performed to cure the sealant 202. Alternatively, when a photocurable resin is used for the sealant 202, the sealant 202 is cured by irradiating the photocurable resin with light having a wavelength with which the photocurable resin reacts.

Through the above steps, the liquid crystal display device 300 of this embodiment can be manufactured. The manufactured liquid crystal display device 300 is carried out from the unloading chamber 60 illustrated in FIG. 1.

As described above, using a manufacturing apparatus of one embodiment of the present invention, the first substrate 100, or the first substrate 100 and the second substrate 200 is/are heated in a reduced pressure atmosphere, so that water can be removed from the organic resin film provided over the substrate. A compound including hydrogen such as water is an impurity which imparts n-type conductivity to an oxide semiconductor, which becomes a factor of a change in the electrical characteristics of a transistor using an oxide semiconductor. Thus, the concentration of water to be mixed in the display device is decreased, whereby reliability of the transistor can be improved.

Further, moisture is easily adsorbed to the organic resin film. Thus, even if water is removed by heat treatment, entry of water is likely to occur when the organic resin film is exposed to the air. However, in the manufacturing apparatus of this embodiment, the first substrate 100 and the second substrate 200 are bonded to each other without being exposed to the air after water is removed by the heat treatment. Accordingly, entry of impurities such as water into the display device can be suppressed. Therefore, a highly reliable semiconductor device can be provided.

The methods and structures described in this embodiment can be combined as appropriate with any of the methods and structures described in the other embodiments.

(Embodiment 3)

An example of an oxide semiconductor which is preferably used for the region in the transistor where a channel is formed which is exemplified in the above embodiment is described below.

An oxide semiconductor has a wide energy gap of 3.0 eV or more. A transistor including an oxide semiconductor film obtained by processing of the oxide semiconductor in an appropriate condition and a sufficient reduction in carrier density of the oxide semiconductor can have much lower leakage current between a source and a drain in an off state (off-state current) than a conventional transistor including silicon.

An applicable oxide semiconductor preferably contains at least indium (In) or zinc (Zn). In particular, In and Zn are preferably contained. In addition, as a stabilizer for reducing a change in the electrical characteristics of a transistor using the oxide semiconductor, one or more elements selected from gallium (Ga), tin (Sn), hafnium (Hf), zirconium (Zr), titanium (Ti), scandium (Sc), yttrium (Y), and a lanthanoid (such as cerium (Ce), neodymium (Nd), or gadolinium (Gd)) is preferably contained.

As the oxide semiconductor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—

Zn-based oxide, an In—Sn—Hf—Zn-based oxide, or an In—Hf—Al—Zn-based oxide.

Here, an "In—Ga—Zn-based oxide" means an oxide containing In, Ga, and Zn as its main components and there is no particular limitation on the ratio of In:Ga:Zn.

The In—Ga—Zn-based oxide may contain a metal element other than the In, Ga, and Zn.

Alternatively, a material represented by $InMO_3(ZnO)_m$ (in >0 is satisfied) may be used as an oxide semiconductor. Note that M represents one or more metal elements selected from Ga, Fe, Mn, and Co, or the above-described element as a stabilizer. Alternatively, as the oxide semiconductor, a material expressed by a chemical formula, $In_2SnO_5(ZnO)_n$ (n>0, n is an integer) may be used.

For example, In—Ga—Zn-based oxide with an atomic ratio where In:Ga:Zn=1:1:1, In:Ga:Zn=3:1:2, or In:Ga:Zn=2:1:3, or an oxide whose composition is in the neighborhood of the above compositions can be used.

The oxide semiconductor film may be either single crystal or non-single-crystal. In the latter case, the oxide semiconductor film may be any of an amorphous oxide semiconductor film, a microcrystalline oxide semiconductor film, a polycrystalline oxide semiconductor film, and a c-axis aligned crystalline oxide semiconductor (CAAC-OS) film. The oxide semiconductor film is preferably a CAAC-OS film.

A structure of an oxide semiconductor film is described below.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits a cube whose one side is less than 10 nm, less than 5 nm, or less than 3 nm.

The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned with a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depends on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

With the use of the CAAC-OS film in a transistor, a change in the electrical characteristics of the transistor due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

For example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In this case, the flat-plate-like sputtered particle or the pellet-like sputtered particle reaches a surface where the CAAC-OS film is to be deposited while maintaining its crystal state, whereby the CAAC-OS film can be deposited.

The flat-plate-like sputtered particle has, for example, a diameter of a circle corresponding to a plane that is parallel to an a-b plane greater than or equal to 3 nm and less than or equal to 10 nm and a thickness (length in the direction perpendicular to the a-b plane) greater than or equal to 0.7 nm and less than 1 nm. Note that in the flat-plate-like sputtered particle, the plane parallel to the a-b plane may be a regular triangle or a regular hexagon. Here, the term "equivalent circle diameter on a plane" refers to the diameter of a perfect circle having the same area as the plane.

For the deposition of the CAAC-OS film, the following conditions are preferably used.

By increasing the substrate temperature during the deposition, migration of a sputtered particle is likely to occur after the sputtered particle reaches a substrate surface. Specifically, the substrate temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate, so that a flat plane of the sputtered particle is attached to the substrate. At this time, the sputtered particle is charged positively, whereby sputtered particles are attached to the substrate while repelling each other; thus, the sputtered particles do not overlap with each other randomly, and a CAAC-OS film with a uniform thickness can be deposited.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

Furthermore, it is preferable that the proportion of oxygen in the deposition gas be increased and the power be optimized in order to reduce plasma damage at the deposition. The proportion of oxygen in the deposition gas is 30 vol. % or higher, preferably 100 vol. %.

After the CAAC-OS film is deposited, heat treatment may be performed. The temperature of the heat treatment is higher than or equal to 100° C. and lower than or equal to 740° C., preferably higher than or equal to 200° C. and lower than or equal to 500° C. Further, the heat treatment is performed for 1 minute to 24 hours, preferably 6 minutes to 4 hours. The heat treatment may be performed in an inert atmosphere or an oxidation atmosphere. It is preferable to perform heat treatment in an inert atmosphere and then to perform heat treatment in an oxidation atmosphere. The heat treatment in an inert atmosphere can reduce the concentration of impurities in the CAAC-OS film for a short time. At the same time, the heat treatment in an inert atmosphere may generate oxygen vacancies in the CAAC-OS film. In this case, the heat treatment in an oxidation atmosphere can reduce the oxygen vacancies. The heat treatment can further increase the crystallinity of the CAAC-OS film. Note that the heat treatment may be performed under a reduced pressure, such as 1000 Pa or lower, 100 Pa or lower, 10 Pa or lower, or 1 Pa or lower. The heat treatment under the reduced atmosphere can reduce the concentration of impurities in the CAAC-OS film for a shorter time.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 1:1:1, 1:1:2, 1:3:2, 2:1:3, 2:2:1, 3:1:1, 3:1:2, 3:1:4, 4:2:3, 8:4:3, or a ratio close to these ratios. The kinds of powder and the molar ratio for mixing powder may be determined as appropriate depending on the desired sputtering target.

Alternatively, the CAAC-OS film is formed in the following manner.

First, a first oxide semiconductor film is formed to a thickness of greater than or equal to 1 nm and less than 10 nm. The oxide semiconductor film is preferably formed by a sputtering method. Specifically, the substrate temperature during the deposition is higher than or equal to 100° C. and lower than or equal to 500° C., preferably higher than or equal to 150° C. and lower than or equal to 450° C., and the proportion of oxygen in the deposition gas is higher than or equal to 30 vol. %, preferably 100 vol. %.

Next, heat treatment is performed so that the first oxide semiconductor film serves as a first CAAC-OS film with high crystallinity. The heat treatment is performed at a temperature higher than or equal to 350° C. and lower than or equal to 740° C., preferably higher than or equal to 450° C. and lower than or equal to 650° C. Further, the heat treatment is performed for 1 minute to 24 hours, preferably 6 minutes to 4 hours. The heat treatment may be performed in an inert atmosphere or an oxidation atmosphere. It is preferable to perform heat treatment in an inert atmosphere and then to perform heat treatment in an oxidation atmosphere. The heat treatment in an inert atmosphere can reduce the concentration of impurities in the first oxide semiconductor film for a short time. At the same time, the heat treatment in an inert atmosphere may generate oxygen vacancies in the first oxide semiconductor film. In this case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under the reduced atmosphere can reduce the concentration of impurities in the first oxide semiconductor film for a shorter time.

The first oxide semiconductor film can be crystallized easier in the case where the thickness is greater than or equal to 1 nm and less than 10 nm than in the case where the thickness is greater than or equal to 10 nm.

Next, a second oxide semiconductor film that has the same composition as the first oxide semiconductor film is formed to a thickness of greater than or equal to 10 nm and less than or equal to 50 nm. The second oxide semiconductor film is preferably formed by a sputtering method. Specifically, the substrate temperature during the deposition is higher than or equal to 100° C. and lower than or equal to 500° C., preferably higher than or equal to 150° C. and lower than or equal to 450° C., and the proportion of oxygen in the deposition gas is higher than or equal to 30 vol. %, preferably 100 vol. %.

Next, heat treatment is performed so that solid phase growth of the second oxide semiconductor film from the first CAAC-OS film is performed. Thus, the second CAAC-OS film can have high crystallinity. The temperature of the heat treatment is higher than or equal to 350° C. and lower than or equal to 740° C., preferably higher than or equal to 450° C. and lower than or equal to 650° C. Further, the heat treatment is performed for 1 minute to 24 hours, preferably 6 minutes to 4 hours. The heat treatment may be performed in an inert atmosphere or an oxidation atmosphere. It is preferable to perform heat treatment in an inert atmosphere and then to perform heat treatment in an oxidation atmosphere. The heat treatment in an inert atmosphere can reduce the concentration of impurities in the second oxide semiconductor film for a short time. At the same time, the heat treatment in an inert atmosphere may generate oxygen vacancies in the second oxide semiconductor film. In this case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under a reduced pressure can reduce the concentration of impurities in the second oxide semiconductor film in a shorter time.

In the above-described manner, a CAAC-OS film can be formed

Further, when the oxide semiconductor film contains a large amount of hydrogen, the hydrogen and an oxide semiconductor are bonded to each other, so that part of the hydrogen serves as a donor and causes generation of an electron which is a carrier. As a result, the threshold voltage of the transistor shifts in the negative direction. Accordingly, the concentration of hydrogen in the oxide semiconductor film is preferably lower than $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$, further more preferably lower than or equal to $1 \times 10^{16}$ atoms/cm$^3$. Note that the concentration of hydrogen in the oxide semiconductor film is measured by secondary ion mass spectrometry (SIMS).

After formation of the oxide semiconductor film, it is preferable that dehydration treatment (dehydrogenation treatment) be performed to remove hydrogen or moisture from the oxide semiconductor film so that the oxide semiconductor film is highly purified to contain impurities as little as possible, and that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment, or treatment for making the oxygen content of an oxide semiconductor film be in excess of that of the stoichiometric composition may be expressed as treatment for making an oxygen-excess state.

In this manner, hydrogen or moisture is removed from the oxide semiconductor film by dehydration treatment (dehydrogenation treatment) and oxygen vacancies therein are filled by oxygen adding treatment, whereby the oxide semiconductor film can be turned into an i-type (intrinsic) or substantially i-type oxide semiconductor film. The oxide semiconductor film formed in such a manner includes extremely few (close to zero) carriers derived from a donor, and the carrier concentration thereof is lower than $1 \times 10^{14}$/cm$^3$, preferably lower than $1 \times 10^{12}$/cm$^3$, further preferably lower than $1 \times 10^{11}$/cm$^3$, still further preferably lower than $1.45 \times 10^{10}$/cm$^3$.

The transistor including the oxide semiconductor layer which is highly purified by sufficiently reducing the hydrogen concentration, and in which density of defect levels in the energy gap due to oxygen vacancies are reduced by sufficiently supplying oxygen can achieve excellent off-state current characteristics. For example, the off-state current per micrometer in the channel width with a channel length of 1 μm at room temperature (25° C.) is less than or equal to 100 yA (1 yA (yoctoampere) is $1 \times 10^{-24}$ A), desirably less than or equal to 10 yA. In addition, the off-state current per micrometer in the channel width at 85° C. is less than or equal to 100 zA (1 zA (zeptoampere) is $1 \times 10^{-21}$ A), desirably less than or equal to 10 zA. In this manner, the transistor which has extremely favorable off-state current characteristics can be obtained with the use of an i-type (intrinsic) or substantially i-type oxide semiconductor layer.

Further, the oxide semiconductor film may have a structure in which a plurality of oxide semiconductor films is stacked.

For example, the oxide semiconductor film may be a stack of a first oxide semiconductor film, a second oxide semiconductor film, and a third oxide semiconductor film which have different compositions.

Between the oxide semiconductor film (referred to as a first layer for convenience) and a gate insulating film, a second layer which is formed of a constituent element of the first layer and whose electron affinity is lower than that of the first layer by 0.2 eV or more may be provided. At this time, when an electric field is applied from the gate electrode, a channel is formed in the first layer, and the channel is not formed in the second layer. The element included in the first layer is the same as that in the second layer; thus, interface scattering at the interface between the first layer and the second layer hardly occurs. Thus, provision of the second layer between the first layer and the gate insulating film can increase the field-effect mobility of the transistor.

Further, when a silicon oxide film, a silicon oxynitride film, a silicon nitride oxide film, or a silicon nitride film is used as the gate insulating film, silicon included in the gate insulating film may be mixed into the oxide semiconductor film. When silicon is included in the oxide semiconductor film, a decrease in crystallinity of the oxide semiconductor film, a decrease in carrier mobility, or the like occurs. Thus, the second layer is preferably provided between the first layer and the gate insulating film so that the concentration of silicon in the first layer where a channel is formed is reduced. For the same reason, it is preferable that a third layer which is formed of the constituent element of the first layer and whose electron affinity is lower than that of the first layer by 0.2 eV or more be provided and that the first layer be sandwiched between the second layer and the third layer.

The methods and structures described in this embodiment can be combined as appropriate with any of the methods and structures described in the other embodiments.

(Embodiment 4)

In this embodiment, an example of a semiconductor device (also referred to as a display device) having a display function which is manufactured using the manufacturing apparatus described in Embodiment 1 is described.

Figure 8A:
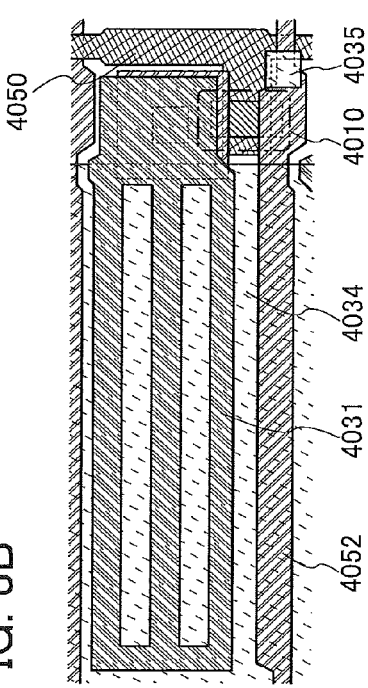
FIGS. 8A to 8C each illustrate a structural example of a display device of one embodiment.

FIG. 8A is a plan view of a display device of this embodiment. In FIG. 8A, a sealant 4005 is provided so as to surround a pixel portion 4002 and a scan line driver circuit 4004 which are provided over a substrate 4001. A substrate 4006 is provided over the pixel portion 4002 and the scan line driver circuit 4004. Consequently, the pixel portion 4002 and the scan line driver circuit 4004 are sealed together with a display element by the substrate 4001, the sealant 4005, and the substrate 4006. In FIG. 8A, an IC chip is mounted on a region of the substrate 4001, which is different from the region surrounded by the sealant 4005; alternatively, a signal line driver circuit 4003 which is formed using a single crystal semiconductor film or a polycrystalline semiconductor film is formed over a substrate separately prepared. A variety of signals and potentials which are provided for the pixel portion 4002 through the signal line driver circuit 4003 and the scan line driver circuit 4004 are supplied from a flexible printed circuit (FPC) 4018.

Although FIG. 8A illustrates an example in which the signal line driver circuit 4003 is formed separately and mounted on the first substrate 4001, the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method, or the like can be used. FIG. 8A illustrates an example in which the signal line driver circuit 4003 is mounted by a COG method.

Note that the display device includes a panel in which the display element is sealed, and a module in which an IC including a controller or the like is mounted on the panel. In other words, the display device in this specification means an image display device or a light source (including a lighting device). Furthermore, the display device also includes the following modules in its category: a module to which a connector such as an FPC or a Tape Carrier Package (TCP) is attached; a module having a TCP at the tip of which a printed wiring board is provided; and a module in which an integrated circuit (IC) is directly mounted on a display element by a COG method.

The pixel portion and the scan line driver circuit provided over the substrate include a plurality of transistors, and the transistor described in Embodiment 2 can be applied thereto.

A liquid crystal element (also referred to as a liquid crystal display element) or a light-emitting element (also referred to as a light-emitting display element) can be used as the display element provided in the display device. The light-emitting element includes an element whose luminance is controlled by current or voltage in its category, and specifically includes an inorganic electroluminescent (EL) element, an organic EL element, and the like. Furthermore, a display medium whose contrast is changed by an electric effect, such as an electronic ink display device (electronic paper), can be used.

Figure 8B:
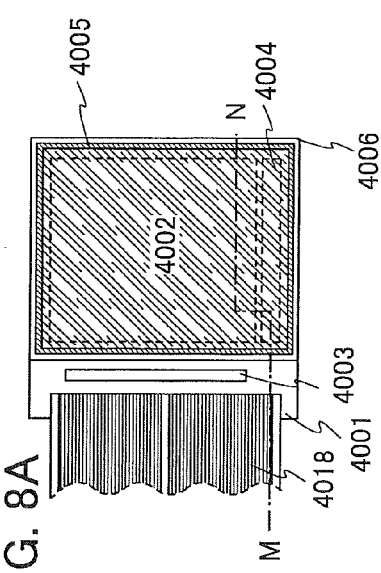
Figure 8C:
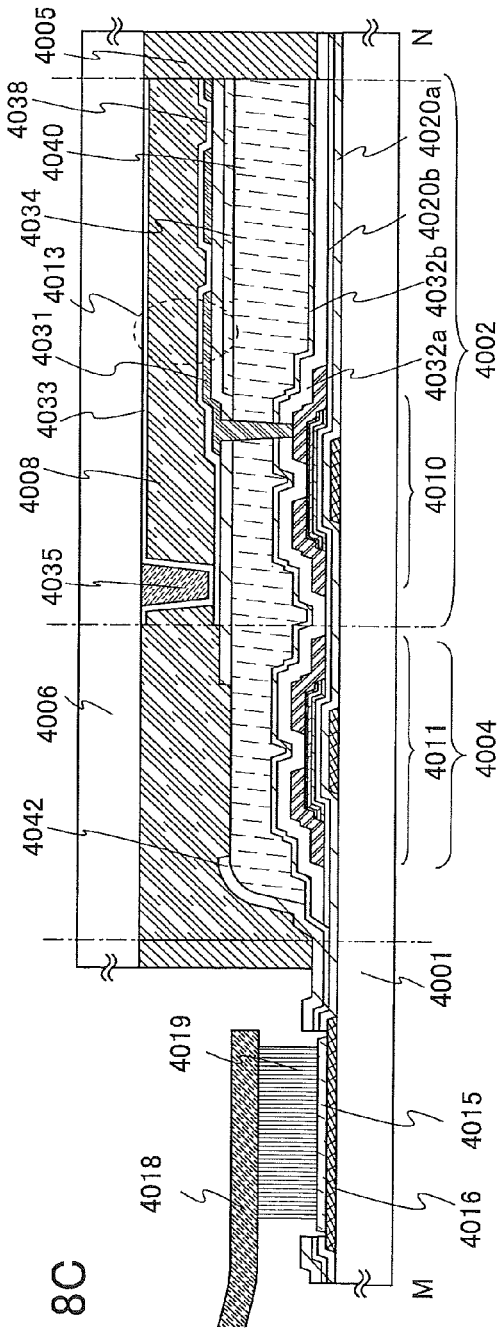

FIG. 8C is a cross-sectional view taken along line M-N in FIG. 8A. An example of a liquid crystal display device using a liquid crystal element as a display element is shown in FIG. 8C. Note that a transistor 4010 provided in the pixel portion 4002 is electrically connected to a display element to form a display panel. A variety of display elements can be used as the display element as long as display can be performed.

A liquid crystal display device can employ a vertical electric field mode or a horizontal electric field mode. FIG. 8C illustrates an example in which a fringe field switching (FFS) mode is employed.

As illustrated in FIGS. 8A and 8C, the semiconductor device includes a connection terminal electrode 4015 and a terminal electrode 4016. The connection terminal electrode 4015 and the terminal electrode 4016 are electrically connected to a terminal included in the FPC 4018 through an anisotropic conductive layer 4019.

The connection terminal electrode 4015 is formed from the same conductive layer as a first electrode layer 4034. The terminal electrode 4016 is formed from the same conductive layer as gate electrode layers of the transistor 4010 and a transistor 4011.

A plurality of thin film transistors are included in a pixel portion 4002 and a scan line driver circuit 4004 which are formed over the first substrate 4001. FIG. 8C illustrates the transistor 4010 included in the pixel portion 4002 and the transistor 4011 included in the scan line driver circuit 4004, and insulating layers 4032a and 4032b are provided over the transistors 4010 and 4011.

In FIG. 8C, a planarization insulating layer 4040 is provided over the insulating layer 4032b, and an insulating layer 4042 is provided between the first electrode layer 4034 and a second electrode layer 4031.

The transistor including an oxide semiconductor in a channel formation region which is described in Embodiment 2 can be used for each of the transistors 4010 and 4011. The transistors 4010 and 4011 are bottom-gate transistors.

A gate insulating layer included in the transistors 4010 and 4011 can have a single layer structure or a stacked structure. In this embodiment, the gate insulating layer may have a stacked structure including a gate insulating layers 4020a and 4020b. In FIG. 8C, the gate insulating layer 4020a and the insulating layer 4032b extend below the sealant 4005 to cover the end portion of the connection terminal electrode 4015, and the insulating layer 4032b covers side surfaces of the gate insulating layer 4020b and the insulating layer 4032a.

Moreover, a conductive layer may be provided so as to overlap with a channel formation region of the oxide semiconductor layer of the transistor 4011 for the driver circuit. The conductive layer is provided at the position overlapping with the channel formation region of the oxide semiconductor layer, whereby the amount of shift in threshold voltage of the transistor 4011 can be reduced.

The conductive layer also has a function of blocking an external electric field, that is, to prevent an external electric field (particularly, to prevent static electricity) from effecting the inside (a circuit portion including a transistor). The blocking function of the conductive layer can prevent a change in the electrical characteristics of the transistor due to the effect of the external electric field such as static electricity.

Here, the planarization insulating layer 4040 corresponds to the organic resin film described in Embodiment 1. The planarization insulating layer 4040 can be formed using an organic resin such as, an acrylic resin, a polyimide resin, a benzocyclobutene-based resin, a polyamide resin, or an epoxy resin. Other than such organic materials, a low-dielectric constant material (a low-k material) or a siloxane-based resin can be used. By application of the method described in Embodiment 1, impurities such as water in the planarization insulating layer 4040 is extremely reduced. Thus, a change in the electrical characteristics of the transistor is suppressed, and a significantly reliable display device can be realized.

In FIG. 8C, a liquid crystal element 4013 includes the first electrode layer 4034, the second electrode layer 4031, and a liquid crystal layer 4008. Note that insulating layers 4033 and 4038 functioning as alignment films are provided so that the liquid crystal layer 4008 is interposed therebetween.

In the liquid crystal element 4013, the second electrode layer 4031 having an opening pattern is provided below the liquid crystal layer 4008, and the first electrode layer 4034 having a flat plate shape is provided below the second electrode layer 4031 with the insulating layer 4042 provided therebetween. The second electrode layer 4031 having an opening pattern includes a bent portion or a branched comb-shaped portion. The provision of the opening pattern for the second electrode layer 4031 enables an electric field to be generated between electrodes of the first electrode layer 4034 and the second electrode layer 4031. Note that a structure may be employed in which the second electrode layer 4031 having a flat plate shape is formed on and in contact with the planarization insulating layer 4040, and the first electrode layer 4034 having an opening pattern and serving as a pixel electrode is formed over the second electrode layer 4031 with the insulating layer 4042 provided therebetween.

The first electrode layer 4034 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or graphene.

Alternatively, the first electrode layer 4034 and the second electrode layer 4031 can be formed using one or more materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy of any of these metals; and a nitride of any of these metals.

A conductive composition containing a conductive high molecule (also referred to as a conductive polymer) can be used for the first electrode layer 4034 and the second electrode layer 4031.

A columnar spacer denoted by reference numeral 4035 is obtained by selective etching of an insulating layer and is provided in order to control the thickness of the liquid crystal layer 4008 (a cell gap). Alternatively, a spherical spacer may be used.

Alternatively, a liquid crystal composition exhibiting a blue phase for which an alignment film is unnecessary may be used for the liquid crystal layer 4008. In this case, the liquid crystal layer 4008 is in contact with the first electrode layer 4034 and the second electrode layer 4031.

In the liquid crystal display device of this embodiment illustrated in FIG. 8C, the substrate 4001 provided with the transistors 4010 and 4011, the insulating layers 4032a and 4032b, the planarization insulating layer 4040, the first electrode layer 4034, the insulating layer 4042, the second electrode layer 4031, and the insulating layer 4038 functioning as an alignment film corresponds to the first substrate 100 in Embodiment 1. Further, the substrate 4006 provided with the spacer 4035 and the insulating layer 4033 functioning as an alignment film corresponds to the second substrate 200 in Embodiment 1. The liquid crystal display device of this embodiment can be formed in such a manner that the insulating layers 4038 and 4033 functioning as alignment films are formed over the substrates 4001 and 4006, respectively, rubbing treatment and cleaning after the rubbing treatment are performed, and then bonding using the manufacturing apparatus of one embodiment of the present invention is performed.

The substrates 4001 and 4006 are bonded to each other using the manufacturing apparatus described in Embodiment 1, so that moisture included in the planarization insulating layer 4040 can be removed and entry of water can be prevented. Because in the liquid crystal display device of this embodiment, moisture in the display device is reduced, a highly reliable liquid crystal display device in which a change in the electrical characteristics of the transistors 4010 and 4011 is suppressed can be obtained.

Note that the insulating layer 4042 illustrated in FIG. 8C partly has an opening; thus, moisture included in the planarization insulating layer 4040 can be released through the opening. However, the opening is not necessarily provided depending on the quality of the insulating layer 4042 over the planarization insulating layer 4040.

The size of storage capacitor formed in the liquid crystal display device is set considering the leakage current of the transistor provided in the pixel portion or the like so that charge can be held for a predetermined period. The size of the storage capacitor may be set considering the off-state current of a transistor or the like. By using a transistor including the oxide semiconductor layer disclosed in this specification, the size of the storage capacitor can be reduced. Accordingly, the aperture ratio of each pixel can be improved.

In particular, it is preferable that a capacitor as a storage capacitor be not provided and that parasitic capacitance generated between the first electrode layer 4034 and the second electrode layer 4031 be used as a storage capacitor. Without the capacitor, the aperture ratio of a pixel can be further increased.

FIG. 8B illustrates an example of a pixel structure in the case where the capacitor as a storage capacitor is not provided for a pixel. The pixel has an intersection portion of a wiring 4050 electrically connected to the gate electrode layer of the transistor 4010 and a wiring 4052 electrically connected to one of a source electrode layer and a drain electrode layer of the transistor 4010. Since the pixel in FIG. 8B does not include the capacitor as a storage capacitor, the ratio of the area of the second electrode layer 4031 having an opening pattern to the area occupied by the pixel can be made large, and an extremely high aperture ratio can be obtained.

In the transistor including an oxide semiconductor layer, which is disclosed in this specification, the current in an off state (off-state current) can be made small. Accordingly, an electric signal such as image data can be held for a longer period and a writing interval can be set longer. Accordingly, frequency of refresh operation can be reduced, which leads to an effect of suppressing power consumption.

The transistor including an oxide semiconductor layer, which is disclosed in this specification, can have high field-effect mobility; thus, the transistor can operate at high speed. For example, when such a transistor is used for a liquid crystal display device, a switching transistor in a pixel portion and a driver transistor in a driver circuit portion can be formed over one substrate. In addition, by using such a transistor in a pixel portion, a high-quality image can be provided.

In the display device, a black matrix (a light-blocking layer), an optical member (an optical substrate) such as a polarizing member, a retardation member, or an anti-reflection member, and the like are provided as appropriate. For example, circular polarization by a polarizing plate and a retardation plate may be used. In addition, a backlight, a side light, or the like may be used as a light source.

As a display method in the pixel portion, a progressive method, an interlace method or the like can be employed. Further, color elements controlled in a pixel at the time of color display are not limited to three colors: R, G, and B (R, G, and B correspond to red, green, and blue, respectively). For example, R, B, and W (W corresponds to white); R, G, B, and one or more of yellow, cyan, magenta, and the like; or the like can be used. Further, the sizes of display regions may be different between respective dots of color elements. Note that the disclosed invention is not limited to the application to a display device for color display; the disclosed invention can also be applied to a display device for monochrome display.

In addition, the display device is preferably provided with a touch sensor. More intuitively operable electronic devices can be each obtained by using a display device with a touch sensor for an electronic device or the like so that the display device overlaps with the pixel portion 4002.

As the touch sensor provided for the display device, a capacitive touch sensor is preferably used. In addition, a variety of types such as a resistive type, a surface acoustic wave type, an infrared type, and an optical type can be used.

Examples of the capacitive touch sensor are typically of a surface capacitive type, a projected capacitive type, and the like. Further, examples of the projected capacitive type are of a self capacitive type, a mutual capacitive type, and the like mainly in accordance with the difference in the driving method. The use of a mutual capacitive type is preferable because multiple points can be sensed simultaneously.

When a touch sensor is provided for the display device, a layer functioning as a touch sensor can be arranged in various ways.

Figure 9C:
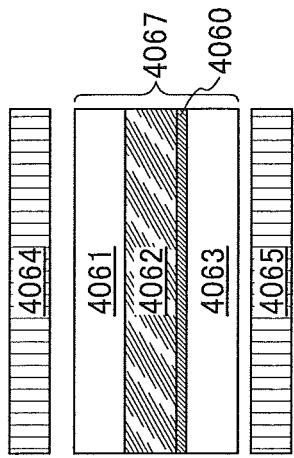
FIGS. 9A to 9C each illustrate a structural example of a display device provided with a touch sensor of one embodiment of the present invention.
Figure 9B:
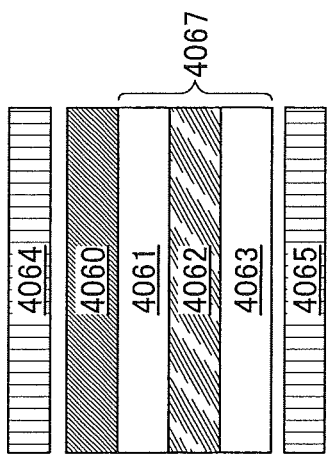
Figure 9A:
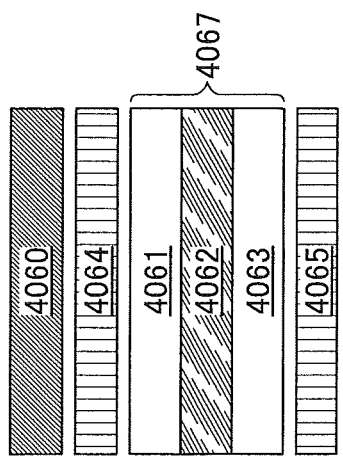

FIGS. 9A to 9C each illustrate a structural example of a display device including a liquid crystal element and a touch sensor.

The display device in FIG. 9A includes a liquid crystal 4062, a pair of substrates (substrates 4061 and 4063) provided with the liquid crystal 4062 therebetween, a pair of polarizing plates (polarizing plates 4064 and 4065) provided outside the substrates 4061 and 4063, and a touch sensor 4060. Here, a structure including the liquid crystal 4062 and the substrates 4061 and 4063 are referred to as a display panel 4067.

The display device in FIG. 9A is a so-called external display device in which the touch sensor 4060 is placed outside the polarizing plate 4064 (or the polarizing plate 4065). With such a structure, the display device can have a touch sensor function in such a manner that the display panel 4067 and the touch sensor 4060 are separately formed and then they are overlapped with each other. Thus, the display device in FIG. 9A can be easily manufactured without a special step.

The display device in FIG. 9B is a so-called on-cell display device in which the touch sensor 4060 is positioned between the polarizing plate 4064 and the substrate 4061 (or between the polarizing plate 4065 and the substrate 4063). With such a structure, the thickness of the display device can be reduced by using the substrate 4061 in common with a formation substrate of the touch sensor 4060, for example.

The display device in FIG. 9C is a so-called in-cell display device in which the touch sensor 4060 is positioned between the substrate 4061 and the substrate 4063. With such a structure, the thickness of the display device can be further reduced. For example, this can be realized in such a manner that a layer functioning as a touch sensor is formed on the liquid crystal 4062 side of a surface of the substrate 4061 (or the substrate 4063) with the use of a transistor, a wiring, an electrode, and the like included in the display panel 4067. Further, in the case of using an optical touch sensor, a structure provided with a photoelectric conversion element may be employed.

Note that the display device including a liquid crystal element is described here; however, a function of a touch sensor can be properly added to various display devices such as a display device provided with an organic EL element and electronic paper.

The methods and structures described in this embodiment can be combined as appropriate with any of the methods and structures described in the other embodiments.

(Embodiment 5)

In this embodiment, examples of an electronic device provided with a display device manufactured using a manufacturing apparatus of one embodiment of the present invention is described with reference to FIGS. 10A to 10F.

Figure 10A:
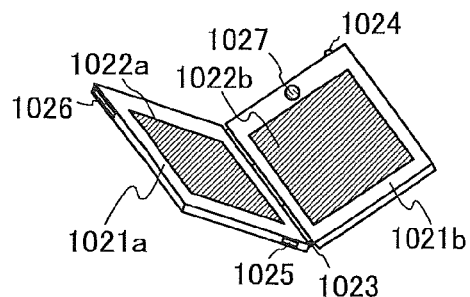
FIGS. 10A to 10F each illustrate an electronic device of one embodiment of the present invention.

The electronic device illustrated in FIG. 10A is an example of a foldable information terminal.

The electronic device illustrated in FIG. 10A has a housing 1021a, a housing 1021b, a panel 1022a provided for the housing 1021a, a panel 1022b provided for the housing 1021b, a hinge 1023, a button 1024, a connection terminal 1025, a recording medium insertion portion 1026, and a speaker 1027.

The housing 1021a and the housing 1021b are connected by the hinge 1023.

Since the electronic device in FIG. 10A includes the hinge 1023, it can be folded so that the panels 1022a and 1022b face each other.

The button 1024 is provided for the housing 1021b. Note that the housing 1021a may also be provided with the button 1024. For example, when the button 1024 which functions as a power button is provided and pushed, supply of a power voltage to the electronic device can be controlled.

The connection terminal 1025 is provided for the housing 1021a. Note that the connection terminal 1025 may be provided on the housing 1021b. Alternatively, a plurality of connection terminals 1025 may be provided on one or both of the housings 1021a and 1021b. The connection terminal 1025 is a terminal for connecting the electronic device illustrated in FIG. 10A to another device.

The recording medium insertion portion 1026 is provided in the housing 1021a. The recording medium insertion portion 1026 may be provided in the housing 1021b. Alternatively, a plurality of recording medium insertion portions 1026 may be provided in one or both of the housings 1021a and 1021b. For example, a card-type recording medium is inserted into the recording medium insertion portion so that data can be read to the electronic device from the card-type recording medium or data stored in the electronic device can be written to the card-type recording medium.

The speaker 1027 is provided on the housing 1021b. The speaker 1027 outputs sound. Note that the speaker 1027 may be provided on the housing 1021a.

Note that the housing 1021a or the housing 1021b may be provided with a microphone, in which case the electronic device in FIG. 10A can function as a telephone, for example The electronic device illustrated in FIG. 10A functions as one or more of a telephone set, an e-book reader, a personal computer, and a game machine, for example.

In the panels 1022a and/or the panel 1022b, the display device manufactured using a manufacturing apparatus of one embodiment of the present invention can be used.

Figure 10B:
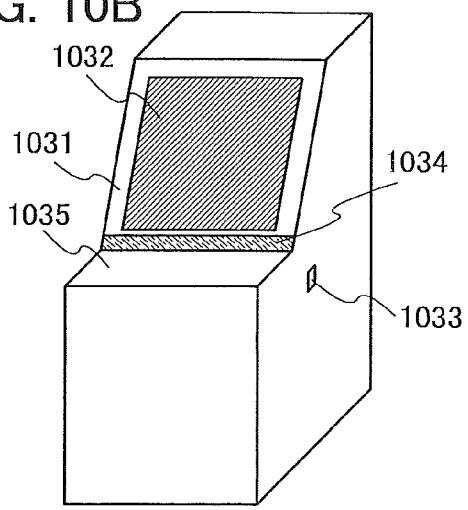

An electronic device in FIG. 10B is an example of a stationary information terminal. The electronic device illustrated in FIG. 10B includes a housing 1031, a panel 1032 provided in the housing 1031, a button 1033, and a speaker 1034.

Note that a panel similar to the panel 1032 may be provided for a deck portion 1035 of the housing 1031.

The housing 1031 may be provided with one or more of a ticket slot from which a ticket or the like is dispensed, a coin slot, and a bill slot.

The button 1033 is provided for the housing 1031. For example, when the button 1033 is a power button, supply of a power voltage to the electronic device can be controlled by pressing the button 1033.

The speaker 1034 is provided for the housing 1031. The speaker 1034 outputs sound.

The electronic device illustrated in FIG. 10B functions as, for example, an automated teller machine, an information communication terminal for ordering a ticket or the like (also referred to as a multi-media station), or a game machine.

In the panel 1032, the display device manufactured using a manufacturing apparatus of one embodiment of the present invention can be used.

Figure 10C:
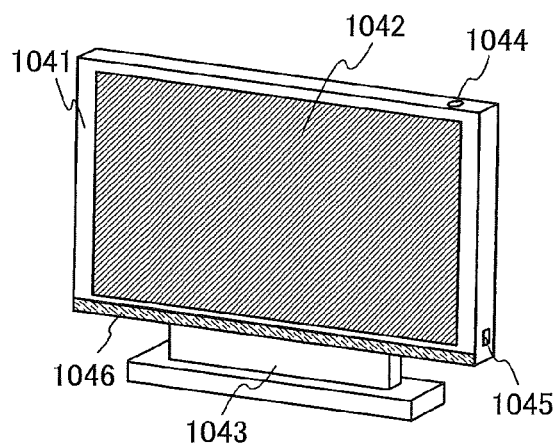

FIG. 10C illustrates an example of a stationary information terminal. The electronic device in FIG. 10C has a housing 1041 provided with a panel 1042, a support 1043 for supporting the housing 1041, a button 1044, a connection terminal 1045, and a speaker 1046.

Note that a connection terminal for connecting the housing 1041 to an external device may be provided.

The button 1044 is provided for the housing 1041. For example, when the button 1044 is a power button, supply of a power voltage to the electronic device can be controlled by pressing the button 1044.

The connection terminal 1045 is provided for the housing 1041. The connection terminal 1045 is a terminal for connecting the electronic device illustrated in FIG. 10C to another device. For example, connecting the electronic device illustrated in FIG. 10C and a personal computer with the connection terminal 1045 enables the panel 1042 to display an image corresponding to a data signal input from the personal computer. For example, when the panel 1042 of the electronic device in FIG. 10C is larger than a panel of another electronic device connected thereto, a displayed image of the another electronic device can be enlarged, so that a plurality of viewers can easily see the image at the same time.

The speaker 1046 is provided on the housing 1041. The speaker 1046 outputs sound.

The electronic device in FIG. 10C functions as at least one of an output monitor, a personal computer, and a television set, for example.

In the panel 1042, the display device manufactured using a manufacturing apparatus of one embodiment of the present invention can be used.

Figure 10D:
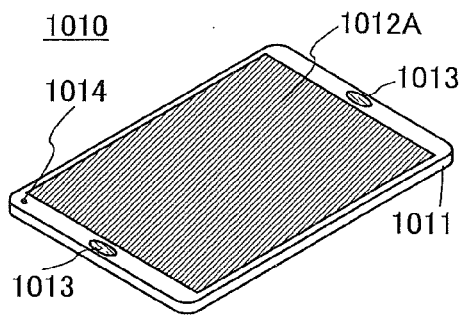
Figure 10E:
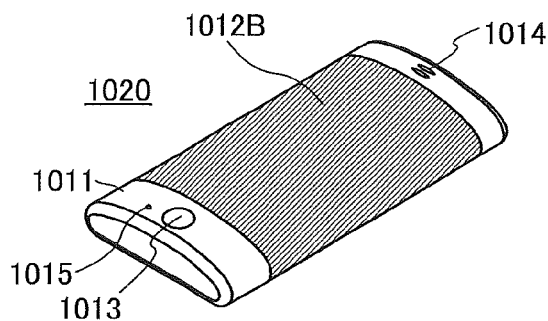

The electronic devices illustrated in FIGS. 10D and 10E are examples of a portable information terminal.

A portable information terminal 1010 illustrated in FIG. 10D is provided with, in addition to a panel 1012A incorporated in a housing 1011, operation buttons 1013, and a speaker 1014. Further, although not shown, the portable information terminal 1010 includes a microphone, an external connection port such as a stereo headphone jack, an insertion port for a memory card, a camera, or a USB connector, and the like.

Here, the display device manufactured using a manufacturing apparatus of one embodiment of the present invention can be used for the panel 1012A.

A portable information terminal 1020 illustrated in FIG. 10E is provided with a panel 1012B that is curved along the side surface of the housing 1011. A portable information terminal including a panel with a curved surface can be obtained by the use of a substrate with a curved surface as a support substrate of a touch sensor and a display element.

A portable information terminal 1020 illustrated in FIG. 10E is provided with, in addition to a display portion 1012B incorporated in the housing 1011, operation buttons 1013, a speaker 1014, a microphone 1015, an external connection port which is not shown such as a stereo headphone jack, an insertion port for a memory card, a camera, or a USB connector, and the like.

The portable information terminals illustrated in FIGS. 10D and 10E each has a function of one or more of a telephone set, an e-book reader, a personal computer, and a game machine.

Figure 10F:
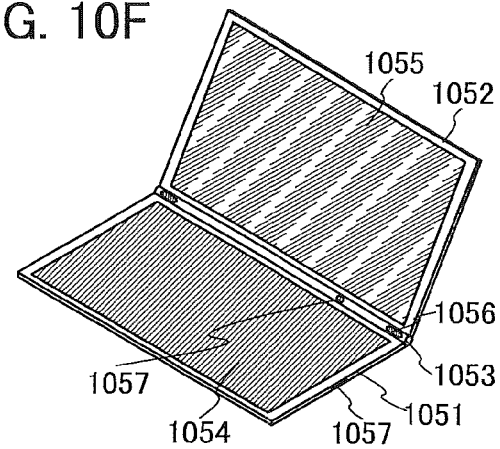

The electronic device illustrated in FIG. 10F is an example of a foldable information terminal.

The electronic device 1050 illustrated in FIG. 10F has a housing 1051, a housing 1052, a panel 1054 provided for the housing 1051, a panel 1055 provided for the housing 1052, a speaker 1056, a start button 1057, and a connection terminal 1025.

In the electronic device 1050 illustrated in FIG. 10F, the housing 1051 and the housing 1052 are connected to each other using a hinge 1053 and can be folded.

A display device manufactured using a manufacturing apparatus of one embodiment of the present invention can be used for at least one of the panel 1054 and the panel 1055.

As described with reference to FIGS. 10A to 10F, a display device of one embodiment of the present invention is used for a panel of an electronic device of this embodiment. The display device has high reliability; thus, the electronic device can have high reliability.

The methods and structures described in this embodiment can be combined as appropriate with any of the methods and structures described in the other embodiments.

EXAMPLE 1

In this example, a liquid crystal display device (liquid crystal panel) manufactured through a cell process using the manufacturing apparatus of one embodiment of the present invention described in Embodiment 1 is described together with a comparative example, and effects of dry treatment and atmosphere control are described.

In this example, a change in operating margin of a scan line driver circuit included in the liquid crystal panel over time was measured. Liquid crystal panels H and I, whose changes in operating margin over time were measured, are liquid crystal panels which were manufactured in the same process up to and including the step of forming an alignment film. In each of the liquid crystal panels H and I, a scan line driver circuit is formed over the same substrate as a pixel, and a 3 μm-thick organic resin film containing an acrylic resin is formed over a transistor included in the scan line driver circuit. Further, a channel formation region of the transistor is formed using an oxide semiconductor layer.

Figure 13:
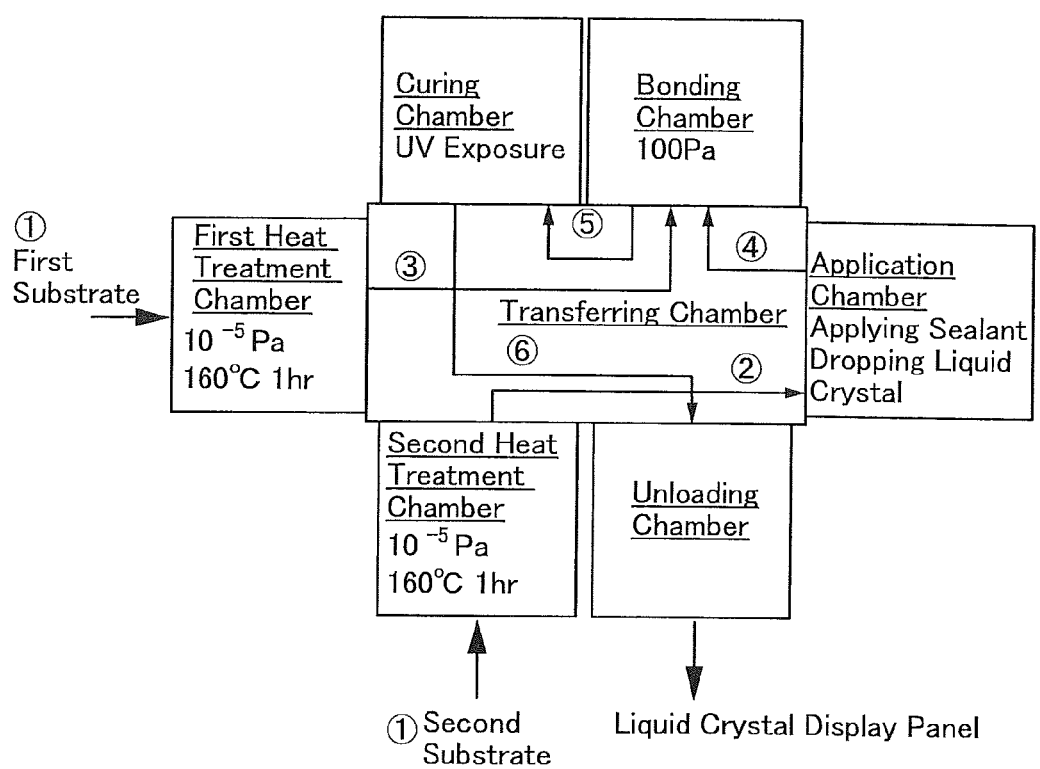
FIG. 13 illustrates one embodiment of a manufacturing apparatus that is used in Example 1.

The liquid crystal panel H is a liquid crystal panel manufactured using the manufacturing apparatus of one embodiment of the present invention. FIG. 13 illustrates the manufacturing apparatus of one embodiment of the present invention which was used for manufacture of the liquid crystal panel H. In FIG. 13, an arrow indicates a movement path of a substrate, and the number surrounded by a circle indicates the order of steps.

The liquid crystal panel H was manufactured in the following manner. A first substrate provided with an organic resin film and an alignment film over a transistor including an oxide semiconductor was prepared, the first substrate of which the alignment film had been baked and subjected to rubbing treatment was carried into a first heat treatment chamber, and heat treatment was performed at 160° C. for one hour in a reduced pressure atmosphere of $10^{-5}$ Pa. After being subjected to the heat treatment, the first substrate was transferred to a bonding chamber and arranged on a second stage.

Further, a second substrate of which an alignment film had been formed, baked, and subjected to rubbing treatment was carried into a second heat treatment chamber, and heat treatment was performed at 160° C. for one hour in a reduced pressure atmosphere of $10^{-5}$ Pa. After that, the second substrate was carried into an application chamber, a sealant was applied in a frame shape, and then a liquid crystal was dropped inside the sealant in a frame shape.

After the drop of the liquid crystal, the second substrate was transferred to a bonding chamber and mounted on a first stage, whereby the second substrate and the first substrate were bonded to each other. The bonding was performed in a reduced pressure atmosphere of 100 Pa. After that, UV lamp irradiation was performed in a curing chamber to cure the sealant. Thus, the liquid crystal panel H in which a liquid crystal layer was sealed between the substrates was manufactured.

On the other hand, the liquid crystal panel I was manufactured in the following manner. After formation of the alignment film on each of the first substrate and the second substrate, heat treatment was performed at 150° C. for six hours in an air atmosphere. After that, a sealant was drawn on one of the substrates, a liquid crystal material was dropped in a region surrounded by the sealant, and the substrates were bonded to each other in a reduced pressure atmosphere. Thus, the liquid crystal panel I in which a liquid crystal layer was sealed between the substrates was manufactured.

An operating margin width (V) of the scan line driver circuit included in each of the liquid crystal panels H and I was examined in such a manner that a start pulse signal and a clock signal were input to a 959-stage sequential circuit included in a shift register of the scan line driver circuit, and a waveform of a signal thereby output from the last stage of the sequential circuit was observed using an oscilloscope.

As the start pulse signal, a signal having a pulse with a 68.3 µsec width which successively appears, with a frequency of 60 Hz, was used. Further, in each of the clock signal and the start pulse signal, a low voltage GVSS was −14 V. The value of high voltage GVDD where the waveform of a signal output from the last stage of the sequential circuit was disordered when a high voltage GVDD of each of the clock signal and the start pulse signal was gradually decreased from +14 V is defined as a voltage at which a malfunction occurs. Further, the difference between +14 V that is the highest voltage GVDD and the malfunction voltage is defined as an operating margin width.

Figure 11:
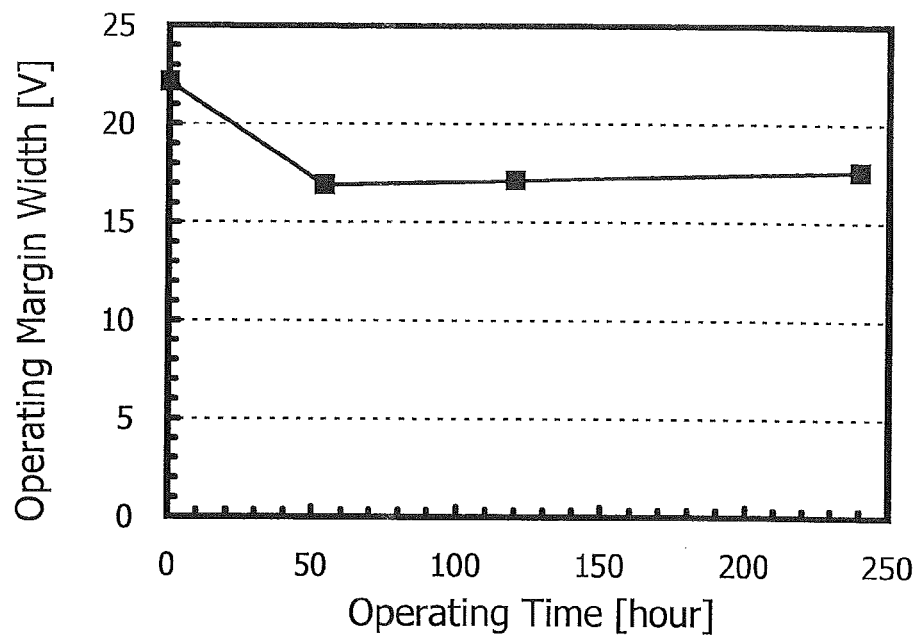
FIG. 11 is a graph showing a change in an operating margin width with respect to operation time of a scan line driver circuit (subjected to heat treatment).

FIG. 11 illustrates the change in an operating margin width (V) with respect to an operation time (hour) in the scan line driver circuit included in the liquid crystal panel H. Further, FIG. 12 illustrates the change in an operating margin width (V) with respect to an operation time (hour) in the scan line driver circuit included in the liquid crystal panel I.

Figure 12:
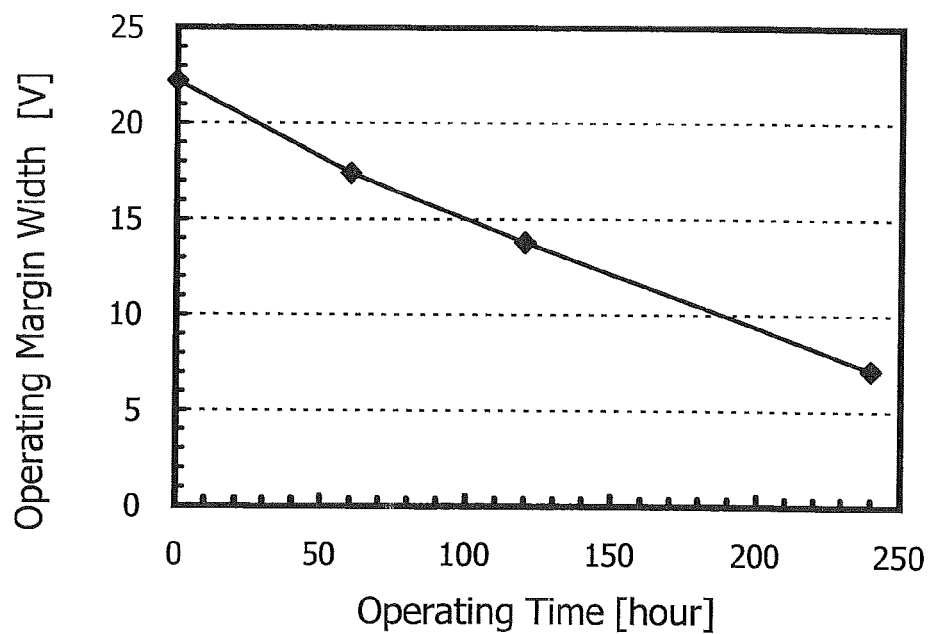
FIG. 12 is a graph showing a change in an operating margin width with respect to operation time of a scan line driver circuit (not subjected to heat treatment).

From FIG. 11 and FIG. 12, the operating margin widths of the liquid crystal panels H and I were the same, about 22 V, at the start of the operation; however, after 220 hours, the operating margin width of the liquid crystal panel H was about 17 V, and the operating margin width of the liquid crystal panel I was about 7 V. Thus, the operating margin width of the liquid crystal panel I was decreased in a shorter time than that of the liquid crystal panel H. Therefore, it is recognized that the amount of shift in the threshold voltage of the transistor included in the scan line driver circuit of the liquid crystal panel H is smaller than that of the liquid crystal panel I.

This shows that the liquid crystal display device manufactured using the manufacturing apparatus of one embodiment of the present invention is a highly reliable liquid crystal display device.

This application is based on Japanese Patent Application serial no. 2012-226893 filed with Japan Patent Office on Oct. 12, 2012, the entire contents of which are hereby incorporated by reference.

What is claimed is:

1. A method for manufacturing a semiconductor device comprising the steps of:
    performing heat treatment in a reduced pressure atmosphere on a first substrate provided with a transistor and an organic film over the transistor;
    applying a sealant to the first substrate or a second substrate;
    disposing the first substrate and the second substrate so as to face each other, and bonding the first substrate and the second substrate with the sealant therebetween; and
    curing the sealant,
    wherein the organic film serves as a planarization film, and
    wherein the steps from performing the heat treatment to curing of the sealant are performed in succession in an atmosphere with a dew point of lower than or equal to −60° C. without exposure to the air.

2. The method for manufacturing a semiconductor device according to claim 1, wherein, heat treatment is performed on the second substrate in a reduced pressure atmosphere before the step of bonding the first substrate and the second substrate.

3. The method for manufacturing a semiconductor device according to claim 1, wherein the steps from performing the heat treatment to curing of the sealant are performed in an inert gas atmosphere.

4. The method for manufacturing a semiconductor device according to claim 1, wherein bonding of the first substrate and the second substrate are performed in a reduced pressure atmosphere.

5. A method for manufacturing a semiconductor device comprising the steps of:
    performing heat treatment in a reduced pressure atmosphere on a first substrate provided with a transistor and an organic film over the transistor;
    applying a sealant with closed-loop shape to the first substrate or a second substrate, and dropping a liquid crystal inside the sealant;

disposing the first substrate and the second substrate so as to face each other, and bonding the first substrate and the second substrate to each other with the sealant therebetween; and curing the sealant, wherein the organic film serves as a planarization film, and wherein the steps from performing the heat treatment to curing of the sealant are performed in succession in an atmosphere with a dew point of lower than or equal to −60° C. without exposure to the air.

6. The method for manufacturing a semiconductor device according to claim 5, wherein heat treatment is performed on the second substrate in a reduced pressure atmosphere before the step of bonding the first substrate and the second substrate to each other.

7. The method for manufacturing a semiconductor device according to claim 5, wherein the steps from performing the heat treatment to curing of the sealant are performed in an inert gas atmosphere.

8. The method for manufacturing a semiconductor device according to claim 5, wherein bonding of the first substrate and the second substrate are performed in a reduced pressure atmosphere.

9. A method for manufacturing a semiconductor device comprising the steps of:

performing heat treatment in a reduced pressure atmosphere on a first substrate provided with a transistor, an organic film over the transistor, and a light-emitting element containing a light-emitting organic compound;

applying a sealant to the first substrate or a second substrate;

disposing the first substrate and the second substrate so as to face each other, and bonding the first substrate and the second substrate with the sealant therebetween; and curing the sealant, wherein the organic film serves as a planarization film, and wherein the steps from performing the heat treatment to curing of the sealant are performed in succession in an atmosphere with a dew point of lower than or equal to −60° C. without exposure to the air.

10. The method for manufacturing a semiconductor device according to claim 9, wherein, heat treatment is performed on the second substrate in a reduced pressure atmosphere before the step of bonding the first substrate and the second substrate to each other.

11. The method for manufacturing a semiconductor device according to claim 9, wherein the steps from performing the heat treatment to curing of the sealant are performed in an inert gas atmosphere.

12. The method for manufacturing a semiconductor device according to claim 9, wherein bonding of the first substrate and the second substrate are performed in a reduced pressure atmosphere.

* * * * *